(12) United States Patent
Iwanczuk et al.

(10) Patent No.: US 6,323,681 B1
(45) Date of Patent: Nov. 27, 2001

(54) CIRCUITS AND METHODS FOR OPERATING A MULTIPLEXER ARRAY

(75) Inventors: Roman Iwanczuk, Los Gatos; Steven P. Young; David P. Schultz, both of San Jose, all of CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/546,305

(22) Filed: Apr. 10, 2000

Related U.S. Application Data

(62) Division of application No. 09/128,733, filed on Aug. 4, 1998, now Pat. No. 6,069,489.

(51) Int. Cl.[7] .................................................. H01L 25/00

(52) U.S. Cl. .............................. 326/41; 326/39; 326/38

(58) Field of Search ................................ 326/38, 39, 41; 327/408

(56) References Cited

U.S. PATENT DOCUMENTS

| | | | |
|---|---|---|---|
| Re. 34,363 | 8/1993 | Freeman | 307/465 |
| 3,849,760 | 11/1974 | Endou et al. | 382/205 |
| 4,750,155 | 6/1988 | Hsieh | 365/307 |
| 4,821,233 | 4/1989 | Hsieh | 365/203 |
| 4,831,586 | 5/1989 | Nakagawa et al. | 365/49 |
| 4,940,909 | * 7/1990 | Mulder et al. | 307/465 |
| 5,208,781 | 5/1993 | Matsushima | 365/236 |
| 5,272,672 | 12/1993 | Ogihara | 365/233 |
| 5,394,031 | 2/1995 | Britton et al. | 326/38 |
| 5,426,379 | 6/1995 | Trimberger | 326/38 |
| 5,457,408 | 10/1995 | Leung | 326/38 |
| 5,485,418 | 1/1996 | Hiraki et al. | 365/49 |

(List continued on next page.)

OTHER PUBLICATIONS

"The Programmable Logic Data Book", published Jul. 1996, by Xilinx, Inc., 2100 Logic Drive, San Jose, California 95124, pp. 4–54 to 4–78.

"The Programmable Logic Data Book", 1993, published by Xilinx, Inc., 2100 Logic Drive, San Jose, California 95124, pp. 8–17 to 8–24.

"The Programmable Logic Data Book" copyright 1994, Xilinx, Inc., 2100 Logic Drive, San Jose, CA 95124.

D.D. Gajski, et al, "Computer Architecture" IEEE Tutorial Manual, IEEE Computer Society, 1987, pp. v–i.

"New IEEE Standard Dictionary of Electrical and Electronics Terms", Fifth Edition, 1993, p. 1011.

Hodges, et al, "Analog MOS Integrated Circuits" IEEE Press, 1980, pp, 2–11.

David A. Patterson and John L. Hennessy, "Computer Architecture: A Quantitive Approach", pp. 200–201, 1990.

*Primary Examiner*—Michael Tokar
*Assistant Examiner*—Anh Tran
(74) *Attorney, Agent, or Firm*—E. Eric Hoffman

(57) ABSTRACT

An FPGA configuration memory is divided into columnar frames each having a unique address. Configuration data is loaded into a configuration register, which transfers configuration data frame by frame in parallel. In a preferred embodiment, an input register, a shadow input register and a multiplexer array permit efficient configuration data transfer using a larger number of input bits than conventional FPGAs. A flexible external interface enables connection with bus sizes varying from a predetermined maximum width down to a selected fraction thereof. Configuration data transfer is made more efficient by using shadow registers to drive such data into memory cells on a frame-by-frame basis with a minimum of delay, and by employing a multiplexer array to exploit a wider configuration data transfer bus. The speed of configuration readback is made substantially equal to the rate of configuration data input by employing configuration register logic that supports bidirectional data transfer. Using the invention, a bit stream designed for an old device can be used for a new device having additional configuration memory cells.

14 Claims, 29 Drawing Sheets

U.S. PATENT DOCUMENTS

| | | | |
|---|---|---|---|
| 5,488,582 | 1/1996 | Camarota | 365/189.5 |
| 5,572,707 * | 11/1996 | Rozman et al. | 395/495.01 |
| 5,638,315 | 6/1997 | Braceras et al. | 365/49 |
| 5,670,897 | 9/1997 | Kean | 326/41 |
| 5,744,995 * | 4/1998 | Young | 327/407 |
| 5,773,993 | 6/1998 | Trimberger | 326/38 |
| 5,883,525 * | 3/1999 | Tavana et al. | 326/39 |
| 5,996,091 * | 11/1999 | Jones et al. | 714/37 |
| 6,011,407 * | 1/2000 | New | 326/39 |
| 6,037,829 * | 3/2000 | Reddy et al. | 327/408 |

* cited by examiner

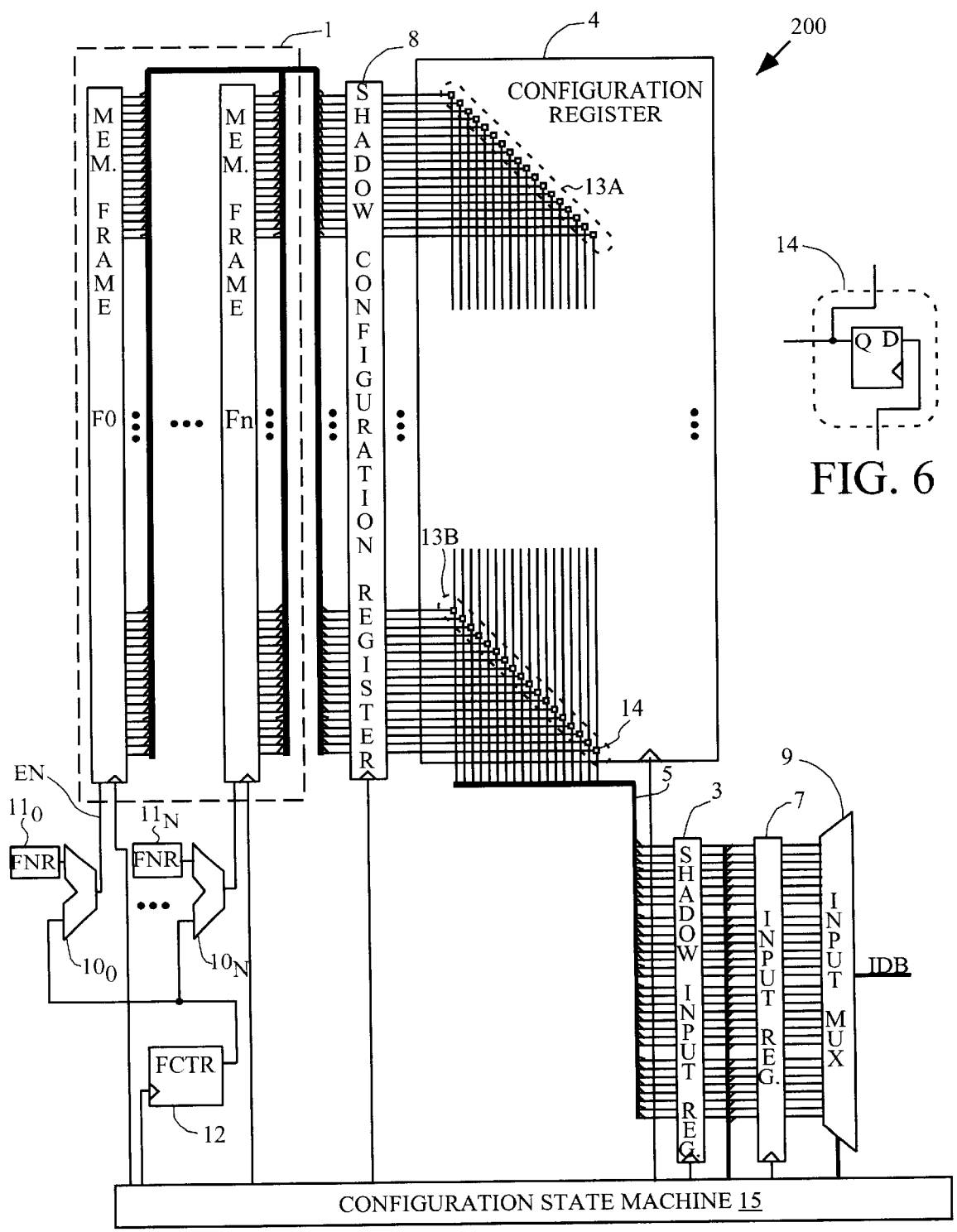
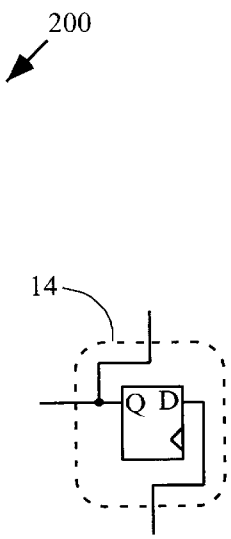
FIG. 6
FIG. 2

700A

| | Input Register 7 | Shadow Input Register 3 |
|---|---|---|
| State 0 | A[31:0] | Unknown/Don't Care |
| State 1 | B[31:0] | A[31:0] |
| State 2 | C[31:0] | B[31:0] |
| State 3 | D[31:0] | C[31:0] |
| State 4 | E[31:0] | D[31:0] |
| State 5 | F[31:0] | E[31:0] |
| State 6 | G[31:0] | F[31:0] |
| State 7 | H[31:0] | G[31:0] |
| State 8 | I[31:0] | H[31:0] |
| State 0' | J[31:0] | I[31:0] |
| State 1' | K[31:0] | J[31:0] |
| State 2' | L[31:0] | K[31:0] |
| State 3' | M[31:0] | L[31:0] |
| State 4' | N[31:0] | M[31:0] |
| State 5' | O[31:0] | N[31:0] |
| State 6' | P[31:0] | O[31:0] |
| State 7' | Q[31:0] | P[31:0] |
| State 8' | R[31:0] | Q[31:0] |
| State 0" | S[31:0] | R[31:0] |
| State 1" | T[31:0] | S[31:0] |
| State 2" | U[31:0] | T[31:0] |

| STATE | CR[39:0] (bits 39 → 0) | LOAD |
|---|---|---|
| 0 | — | N |
| 1 | — | N |
| 2 | $A_{31}\,A_{30}\,A_{29}\,A_{28}\,A_{27}\,A_{26}\,A_{25}\,A_{24}\,A_{23}\,A_{22}\,A_{21}\,A_{20}\,A_{19}\,A_{18}\,A_{17}\,A_{16}\,A_{15}\,A_{14}\,A_{13}\,A_{12}\,A_{11}\,A_{10}\,A_{9}\,A_{8}\,A_{7}\,A_{6}\,A_{5}\,A_{4}\,A_{3}\,A_{2}\,A_{1}\,A_{0}\,B_{31}\,B_{30}\,B_{29}\,B_{28}\,B_{27}\,B_{26}\,B_{25}\,B_{24}$ | Y |
| 3 | $B_{23}\,B_{22}\,B_{21}\,B_{20}\,B_{19}\,B_{18}\,B_{17}\,B_{16}\,B_{15}\,B_{14}\,B_{13}\,B_{12}\,B_{11}\,B_{10}\,B_{9}\,B_{8}\,B_{7}\,B_{6}\,B_{5}\,B_{4}\,B_{3}\,B_{2}\,B_{1}\,B_{0}\,C_{31}\,C_{30}\,C_{29}\,C_{28}\,C_{27}\,C_{26}\,C_{25}\,C_{24}\,C_{23}\,C_{22}\,C_{21}\,C_{20}\,C_{19}\,C_{18}\,C_{17}\,C_{16}$ | Y |
| 4 | $C_{15}\,C_{14}\,C_{13}\,C_{12}\,C_{11}\,C_{10}\,C_{9}\,C_{8}\,C_{7}\,C_{6}\,C_{5}\,C_{4}\,C_{3}\,C_{2}\,C_{1}\,C_{0}\,D_{31}\,D_{30}\,D_{29}\,D_{28}\,D_{27}\,D_{26}\,D_{25}\,D_{24}\,D_{23}\,D_{22}\,D_{21}\,D_{20}\,D_{19}\,D_{18}\,D_{17}\,D_{16}\,D_{15}\,D_{14}\,D_{13}\,D_{12}\,D_{11}\,D_{10}\,D_{9}\,D_{8}$ | Y |
| 0' | $D_{7}\,D_{6}\,D_{5}\,D_{4}\,D_{3}\,D_{2}\,D_{1}\,D_{0}\,E_{31}\,E_{30}\,E_{29}\,E_{28}\,E_{27}\,E_{26}\,E_{25}\,E_{24}\,E_{23}\,E_{22}\,E_{21}\,E_{20}\,E_{19}\,E_{18}\,E_{17}\,E_{16}\,E_{15}\,E_{14}\,E_{13}\,E_{12}\,E_{11}\,E_{10}\,E_{9}\,E_{8}\,E_{7}\,E_{6}\,E_{5}\,E_{4}\,E_{3}\,E_{2}\,E_{1}\,E_{0}$ | Y |
| 1' | — | N |
| 2' | $F_{31}\,F_{30}\,F_{29}\,F_{28}\,F_{27}\,F_{26}\,F_{25}\,F_{24}\,F_{23}\,F_{22}\,F_{21}\,F_{20}\,F_{19}\,F_{18}\,F_{17}\,F_{16}\,F_{15}\,F_{14}\,F_{13}\,F_{12}\,F_{11}\,F_{10}\,F_{9}\,F_{8}\,F_{7}\,F_{6}\,F_{5}\,F_{4}\,F_{3}\,F_{2}\,F_{1}\,F_{0}\,G_{31}\,G_{30}\,G_{29}\,G_{28}\,G_{27}\,G_{26}\,G_{25}\,G_{24}$ | Y |
| 3' | $G_{23}\,G_{22}\,G_{21}\,G_{20}\,G_{19}\,G_{18}\,G_{17}\,G_{16}\,G_{15}\,G_{14}\,G_{13}\,G_{12}\,G_{11}\,G_{10}\,G_{9}\,G_{8}\,G_{7}\,G_{6}\,G_{5}\,G_{4}\,G_{3}\,G_{2}\,G_{1}\,G_{0}\,H_{31}\,H_{30}\,H_{29}\,H_{28}\,H_{27}\,H_{26}\,H_{25}\,H_{24}\,H_{23}\,H_{22}\,H_{21}\,H_{20}\,H_{19}\,H_{18}\,H_{17}\,H_{16}$ | Y |
| 4' | $H_{15}\,H_{14}\,H_{13}\,H_{12}\,H_{11}\,H_{10}\,H_{9}\,H_{8}\,H_{7}\,H_{6}\,H_{5}\,H_{4}\,H_{3}\,H_{2}\,H_{1}\,H_{0}\,I_{31}\,I_{30}\,I_{29}\,I_{28}\,I_{27}\,I_{26}\,I_{25}\,I_{24}\,I_{23}\,I_{22}\,I_{21}\,I_{20}\,I_{19}\,I_{18}\,I_{17}\,I_{16}\,I_{15}\,I_{14}\,I_{13}\,I_{12}\,I_{11}\,I_{10}\,I_{9}\,I_{8}$ | Y |
| 0'' | $I_{7}\,I_{6}\,I_{5}\,I_{4}\,I_{3}\,I_{2}\,I_{1}\,I_{0}\,J_{31}\,J_{30}\,J_{29}\,J_{28}\,J_{27}\,J_{26}\,J_{25}\,J_{24}\,J_{23}\,J_{22}\,J_{21}\,J_{20}\,J_{19}\,J_{18}\,J_{17}\,J_{16}\,J_{15}\,J_{14}\,J_{13}\,J_{12}\,J_{11}\,J_{10}\,J_{9}\,J_{8}\,J_{7}\,J_{6}\,J_{5}\,J_{4}\,J_{3}\,J_{2}\,J_{1}\,J_{0}$ | Y |
| 1'' | — | N |
| 2'' | $K_{31}\,K_{30}\,K_{29}\,K_{28}\,K_{27}\,K_{26}\,K_{25}\,K_{24}\,K_{23}\,K_{22}\,K_{21}\,K_{20}\,K_{19}\,K_{18}\,K_{17}\,K_{16}\,K_{15}\,K_{14}\,K_{13}\,K_{12}\,K_{11}\,K_{10}\,K_{9}\,K_{8}\,K_{7}\,K_{6}\,K_{5}\,K_{4}\,K_{3}\,K_{2}\,K_{1}\,K_{0}\,L_{31}\,L_{30}\,L_{29}\,L_{28}\,L_{27}\,L_{26}\,L_{25}\,L_{24}$ | Y |

CONFIGURATION REGISTER BIT (CR[39:0])

CIRCUITS AND METHODS FOR OPERATING A MULTIPLEXER ARRAY

CROSS-REFERENCE TO RELATED APPLICATIONS

This application is a divisional application of commonly assigned, U.S. patent application Ser. No. 09/128,733 invented by Roman Iwanczuk, Steven P. Young, and David P. Schultz, entitled "FPGA HAVING FAST CONFIGURATION MEMORY DATA READBACK", filed Aug. 4, 1998, Now U.S. Pat. No. 6,069,489 which hereby incorporated by reference.

FIELD OF THE INVENTION

The invention relates to field programmable gate arrays (FPGAs). The invention particularly relates to a structure and method for configuring static random access memory (SRAM)-based FPGAs.

BACKGROUND OF THE INVENTION

The first FPGA with programmable logic cells and programmable routing was described by Freeman in U.S. Pat. No. Re. 34,363, which is incorporated herein by reference. An FPGA includes configurable logic blocks and configurable routing, which are programmed by configuration memory cells. The configuration memory cells are typically arranged in an array and are loaded with a bit stream of configuration data. The configuration data is selected to cause the FPGA to perform a desired function.

FIG. 1 shows a conventional array of configuration memory cells (i.e., a configuration memory) such as used by Xilinx, Inc., assignee of the present invention. The configuration memory of FIG. 1 is a 16-bit by 16-bit array that includes 256 configuration memory cells. In general, each of the configuration memory cells is identified by a reference character Mx-y, where x and y correspond to the row and column of the configuration memory cell. A typical array of configuration memory cells in a commercial device has on the order of 20,000 to one million memory cells. Thus, the array of FIG. 1 is much smaller than is typically used in a commercial embodiment, but nevertheless shows the structure of prior art configuration memories. To load the configuration memory, the bit stream of configuration data is shifted through a data shift register DSR under control of a clocking mechanism (not shown), until a frame of data (16 bits wide in this example) has been shifted into bit positions DS0 through DS15 of the data shift register DSR. This frame of data is then shifted in parallel on lines D0 through D15 into a column of configuration memory cells addressed by address shift register ASR. Typically, some configuration memory cells are missing from the rows and columns. Missing memory cells are often due to idiosyncrasies in the layout of the configuration memory, or to the lack of need for a particular configuration memory cell in a desired logic scheme that still requires a rectangular array for implementation. Dummy bits are inserted into the bit stream as place holders for these missing memory cells. The column is addressed by shifting a token high bit through the address shift register ASR from bit AS0 to bit AS15, one shift per frame. Each time a frame of configuration data is loaded through data shift register DSR, it is loaded in parallel to the column of memory cells selected by the token high bit. When the token high bit shifts out to the right, it activates a DONE circuit, which indicates that configuration is complete and causes the FPGA to become operational.

In a typical FPGA, configuration data is shifted serially into a data shift register, then loaded in parallel into the configuration memory cells. In certain conventional parallel configuration modes, configuration data is loaded onto the device in parallel, and is then serially loaded into a data shift register.

The Xilinx XC5200™ family of FPGAs has a configuration mode called Express mode, in which configuration data is loaded in parallel (i.e., eight bits at a time) into a data shift register. (See "The Programmable Logic Data Book", pp. 4–54 to 4–78, published July 1996 by Xilinx, Inc., 2100 Logic Drive, San Jose, Calif. 95124, hereinafter referred to as the "Xilinx 1996 Data Book".) The Express mode enables a configuration bit stream to be loaded at eight times the rate of the above-described conventional configuration modes. However, Express mode is limited to a single bus width of eight bits. Moreover, the configuration bit stream used in Express mode is not compatible with the configuration bit streams used to configure an XC5200 FPGA in other configuration modes (e.g., a serial configuration mode).

A purchaser of an FPGA may spend days, weeks, or months developing and perfecting a logic design to be implemented by the FPGA and generating the accompanying configuration bit stream to program the FPGA. Companies such as Xilinx, Inc., which manufacture FPGAs and other programmable devices, continue to develop new device architectures (or device families) with new features. Yet these companies continue to sell devices from the older device families because customers would rather use these older devices than repeat or augment the engineering necessary to generate a different configuration bit stream, which is required to cause a newer device to perform the same function as the older device. This means that the FPGA manufacturer must maintain an inventory of an increasing number of device families and maintain the capability to manufacture many device families. However, operating in this manner is inefficient for the FPGA manufacturer. It would therefore be desirable to make the older device families obsolete, thereby minimizing the number of device families that must be held in inventory. It would also be desirable to minimize the number of device families being manufactured in order to optimize manufacturing capacity. It would further be desirable for newer device families to be programmable with the same configuration bit streams as older device families.

One reason new device architectures are continuously arriving on the market is the desire among users for increased device flexibility, size, and speed. Partial reconfigurability, flexible pin allocation, and modified device layout for increased speed are just a few of the innovations only recently introduced to the FPGA marketplace.

While available memory-addressing mechanisms provide certain advantages in writing configuration data, there are a number of disadvantages in existing devices, including the difficulty of testing the devices before shipping to users because of the slow read speed of available configuration memory cells. FIG. 1A is a schematic diagram of a conventional five-transistor configuration memory cell M0-0 that includes one access transistor T1 and two CMOS inverters I1 and I2. As is well known in the CMOS design art, each of the two inverters I1 and I2 comprise one PMOS transistor and one NMOS transistor connected in series between power and ground. Inverters I1 and I2 are connected into a loop, thereby forming a latch. This latch is connected to a data line D0 by a pass transistor T1 that is controlled by address line A0. A line Q or QB (or both) extends from memory cell M0-0 to the FPGA logic structure (not shown) to control configuration. Such a structure is described by Hsieh in U.S. Pat. Nos. 4,750,155 and 4,821,233. As used in existing devices, this cell structure enables only relatively slow data readback capability, with a maximum speed for some devices of only 1 MHz. For a discussion on existing readback circuitry, see "The Programmable Logic Data Book", pp. 8–17 to 8–24, published 1993 by Xilinx, Inc. (hereinafter referred to as the "Xilinx 1993 Data Book"). It would therefore be desirable to be able to rapidly read configuration memory cells.

SUMMARY OF THE INVENTION

The present invention provides a novel structure and method for configuring FPGAs. The invention allows bit streams of various bus widths to be loaded into a single FPGA. The invention further allows distribution of multiple copies of bit stream segments without reloading the desired segments, thereby increasing configuration and testing speed and convenience.

According to the invention, the device configuration memory is divided into frames, each having a frame address, preferably unique. A configuration register is provided, preferably positioned vertically in the center of the device, and capable of storing one frame of data. Parallel bit stream data is loaded into the configuration register one memory word at a time until the configuration register is full. Bit stream data is then loaded in parallel from the configuration register to the configuration memory, one frame being loaded into one configuration memory column each time the configuration register is fully loaded. In other embodiments, the configuration register is segmented and distributed throughout the device to enable faster partial device configuration.

In one embodiment, the same bit stream can be used for multiple device types.

A configuration instruction set (CIS) or instruction code is preferably provided at the beginning of a configuration data bit stream, with an opcode being provided in front of every data frame. Each CIS includes information identifying the device type for which the bit stream is intended. Each opcode includes any special instructions for processing or distributing configuration data, such as duplicate distribution.

Using the bit stream CIS to define the device type of the device to be configured, preferably in combination with a flexible external interface, enables configuration using bus widths varying from a predetermined maximum width down to a selected fraction thereof, without significantly increasing the number of pins needed to accept configuration data. In effect, the configuration bus width has been de-coupled from the size of the configuration memory frame. A multiplexer array and a configuration register distribute configuration data to the appropriate addressable memory frames in response to opcode contents. Frame addressing can be either coded into the bit stream or controlled by registers. Register reset or preset can be accomplished using a signal embedded in the bit stream's CIS.

Bi-directional configuration register logic is preferably incorporated to allow high speed readback of configuration memory data.

The configuration memory structure of the invention provides an FPGA different from earlier FPGAs, but having a configuration bit stream compatible with such earlier FPGAs. The structure of the invention also provides a significantly faster configuration rate than in conventional FPGAs. In some embodiments, partial reconfiguration is provided. Another advantage is that configuration data may be read back at substantially the same rate as the rate at which configuration data is input to the FPGA. Further, configuration data transfer is made more efficient by using shadow registers to load the data into memory cells on a frame-by-frame basis with a minimum of delay. Configuration data transfer is also made more efficient by employing a multiplexer array and a configuration register to exploit a wider configuration data transfer bus. An FPGA according to one embodiment of the invention has an external interface adapted to connect to different width buses, the size of which may be defined by the configuration bit stream or by dedicated pins.

BRIEF DESCRIPTION OF THE DRAWINGS

The present invention is illustrated by way of example, and not by way of limitation, in the following figures, in which like reference numerals refer to similar elements.

FIG. 2 is a circuit diagram of a configuration circuit used to configure an FPGA in accordance with one embodiment of the present invention.

FIG. 6 is a circuit diagram of a 1-bit storage device in a configuration register of the configuration circuit of FIG. 2 in accordance with one embodiment.

FIGS. 8A and 8B are state tables that illustrate a 9-state repeated process implemented by a multiplexer array in accordance with one embodiment of the present invention.

FIG. 15 is a table illustrating a state sequence for configuring the FPGA in response to a type B bit stream.

FIG. 16 is a table illustrating a state sequence for configuring the FPGA in response to a type A bit stream.

FIG. 21 is a state table that illustrates the manner in which the multiplexer array of FIG. 19 routes configuration data values in response to applied control signals.

DETAILED DESCRIPTION OF THE DRAWINGS

Figure 1:
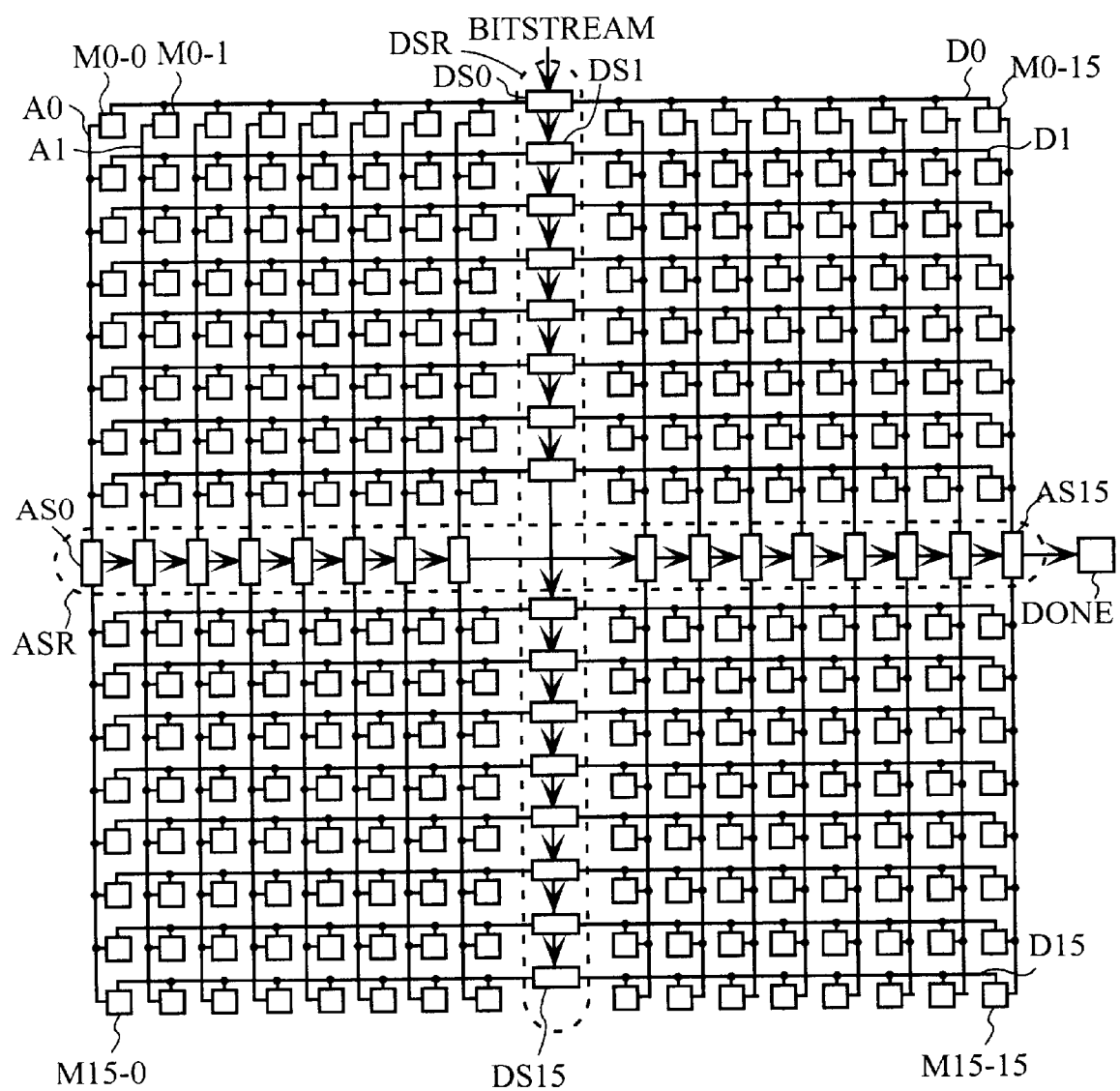
FIG. 1 shows a prior art configuration memory array with a prior art address shift register.
Figure 1A:
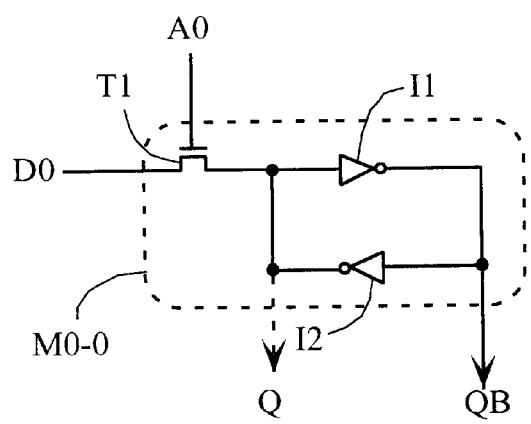
FIG. 1A shows a prior art configuration memory cell structure usable in the memory cells of FIG. 1.

FIG. 2 illustrates a configuration circuit 200 used to configure an FPGA in accordance with one embodiment of the present invention. This circuit 200 includes configuration memory array 1, shadow input register 3, configuration register 4, configuration pre-load bus 5, input register 7, shadow configuration register 8, input multiplexer 9, comparators $10_0$–$10_N$, frame number registers $11_0$–$11_N$, frame counter 12, 1-bit storage device 14, and configuration state machine 15.

A configuration bit stream is provided to input multiplexer 9 on an input data bus (IDB). In the described embodiment, the FPGA can be configured such that the input data bus IDB has a width of 8 bits, 16 bits, or 32 bits. The 8-bit, 16-bit and 32-bit input data buses are referred to as input data buses $IDB_8$, $IDB_{16}$, and $IDB_{32}$, respectively. Input data buses $IDB_8$, $IDB_{16}$, and $IDB_{32}$ route configuration data bits $IDB_8$[7:0], $IDB_{16}$[15:0], and $IDB_{32}$[31:0], respectively. The configuration bit stream is applied to a predetermined set of input/output blocks (IOBs) (e.g., pads) of the FPGA, depending upon the selected width of the input data bus IDB.

Figure 3:
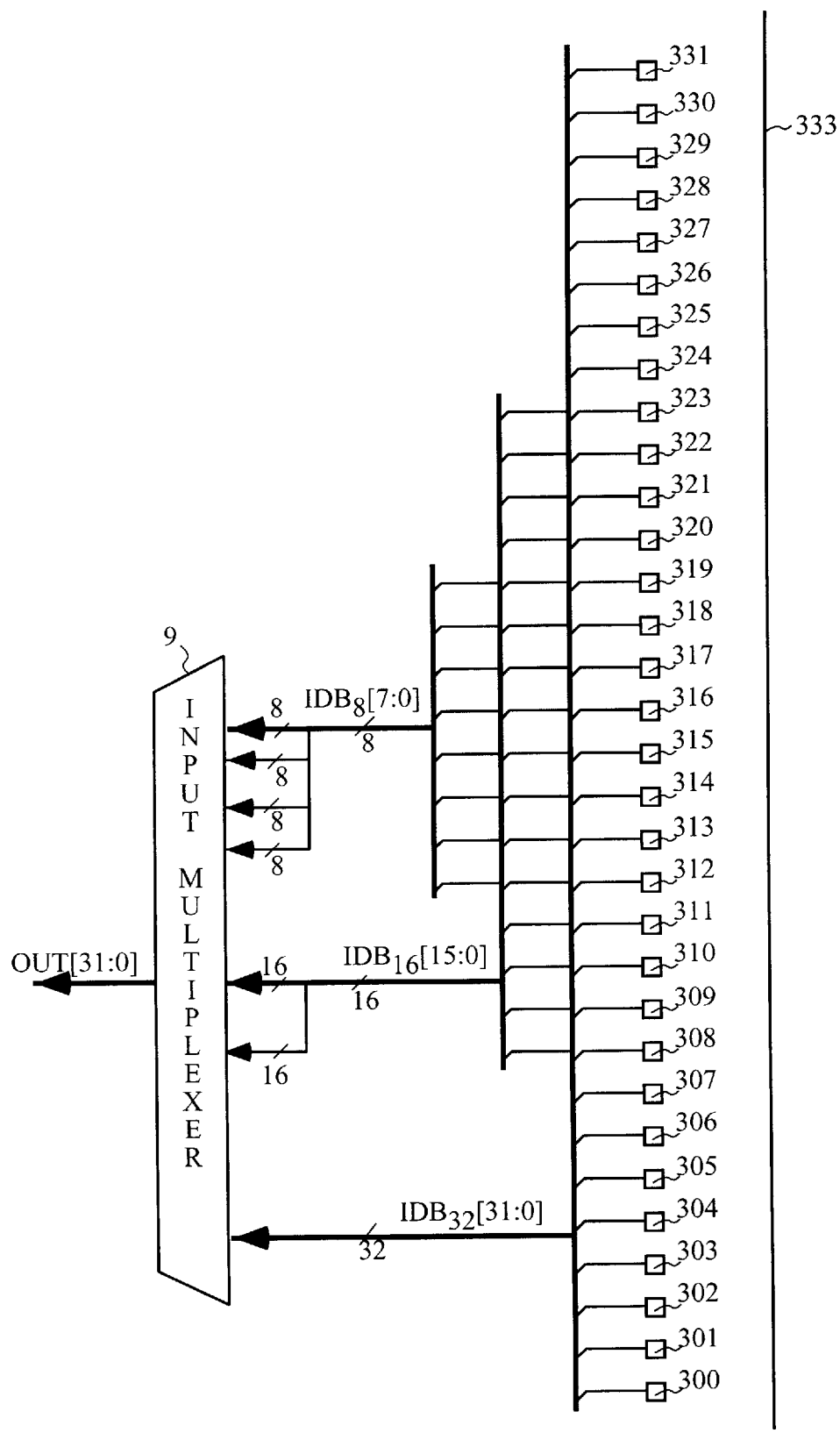
FIG. 3 is a circuit diagram illustrating the interconnections between a predetermined set of input/output blocks (IOBs) and input data buses in accordance with one embodiment of the present invention.

FIG. 3 is a circuit diagram illustrating the interconnections between a predetermined set of IOBs 300–331 and input data buses $IDB_8$, $IDB_{16}$, and $IDB_{32}$ in accordance with one embodiment of the present invention. When the input data bus IDB is selected to have a width of 32-bits, the configuration data is applied as 32-bit words to IOBs 331–300. These IOBs 331–300, in turn, are connected to 32 conductive paths, represented as $IDB_{32}$[31:0], to input multiplexer 9. In this 32-bit mode, input multiplexer 9 is set to pass all 32 bits through to input register 7 (and input data buses $IDB_8$ and $IDB_{16}$ are not routed through input multiplexer 9).

When the input data bus IDB is selected to have a width of 16 bits, the configuration data bits $IDB_{16}$[15:0] are applied to IOBs 323–308, respectively. These IOBs 323–308, in turn, are connected to 16 conductive paths represented by $IDB_{16}$[15:0]. These 16 conductive paths are connected to input multiplexer 9, as illustrated in FIG. 3. In the 16-bit mode, input multiplexer 9 is arranged to pass the 16-bit configuration data on both the upper and lower halves of its 32-bit output. The resulting 32-bit configuration data word is passed through to input register 7. When the input data bus IDB is selected to have a width of 16-bits, IOBs 300–307 and 324–331 can be used for other purposes.

When the input data bus IDB is selected to have a width of 8 bits, the configuration data is applied to IOBs 319–312, which, in turn, are connected to 8 conductive paths, represented by $IDB_8$[7:0]. These 8 conductive paths are connected to input multiplexer 9, as illustrated in FIG. 3. In the 8-bit mode, input multiplexer 9 is arranged to replicate the 8-bit configuration data on the four bytes that make up the 32-bit output of input multiplexer 9. This 32-bit output is provided to input register 7. When IDB is selected to have a width of 8-bits, IOBs 300–311 and 320–331 can be used for other purposes.

In other embodiments, the configuration data bits are assigned to other predetermined sets of IOBS. For example, when the input data bus IDB is selected to have a width of 16 bits, the configuration data bits $IDB_{16}$[15:0] can be applied to either IOBs 315–300 or IOBs 331–316. Similarly, when the input data bus IDB is selected to have a width of 8 bits, the configuration data bits $IDB_8$[7:0] can be applied to either IOBs 307–300, IOBs 315–308, IOBs 323–316 or IOBs 331–324.

The IOBs 300–331 used to connect to the input data bus IDB are preferably placed along a single edge of the FPGA device, shown as a vertical edge 333 in FIG. 3. Configurable logic blocks (CLBs, not shown) are arranged in horizontal rows with one or more IOBs along the vertical edge corresponding to each CLB row. The bits are preferably arranged in numerical order (in the embodiment of FIG. 3, the least significant bit is lowest on the edge). The bits are preferably on contiguous IOBs (excluding power and ground pads, not shown) to ensure convenient connection to user logic inside the FPGA after programming the device.

Referring back to FIG. 2, the width of the input data bus IDB is selected by configuration state machine 15 in response to a configuration instruction set (CIS) present at the beginning of the configuration bit stream. Configuration state machine 15 configures the FPGA such that the appropriate input data bus $IDB_8$, $IDB_{16}$, or $IDB_{32}$ is formed and connected through input multiplexer 9. In another embodiment, the width of the input data bus IDB is selected in response to a plurality of signals provided on mode pins of the FPGA.

Figure 4A:
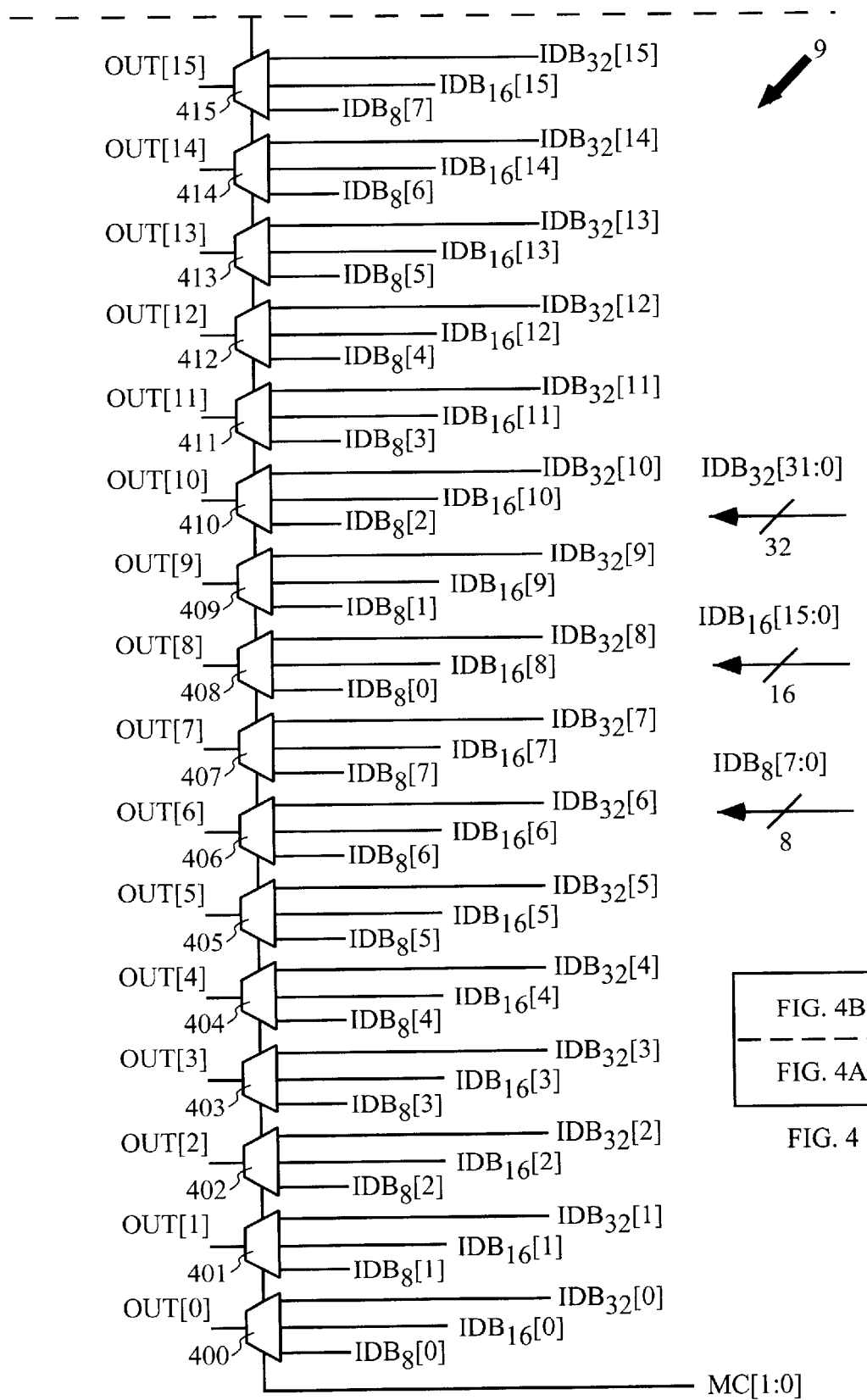
FIG. 4, which consists of FIGS. 4A and 4B, illustrates an input multiplexer of the configuration circuit of FIG. 2 in accordance with one embodiment of the present invention.
Figure 4B:
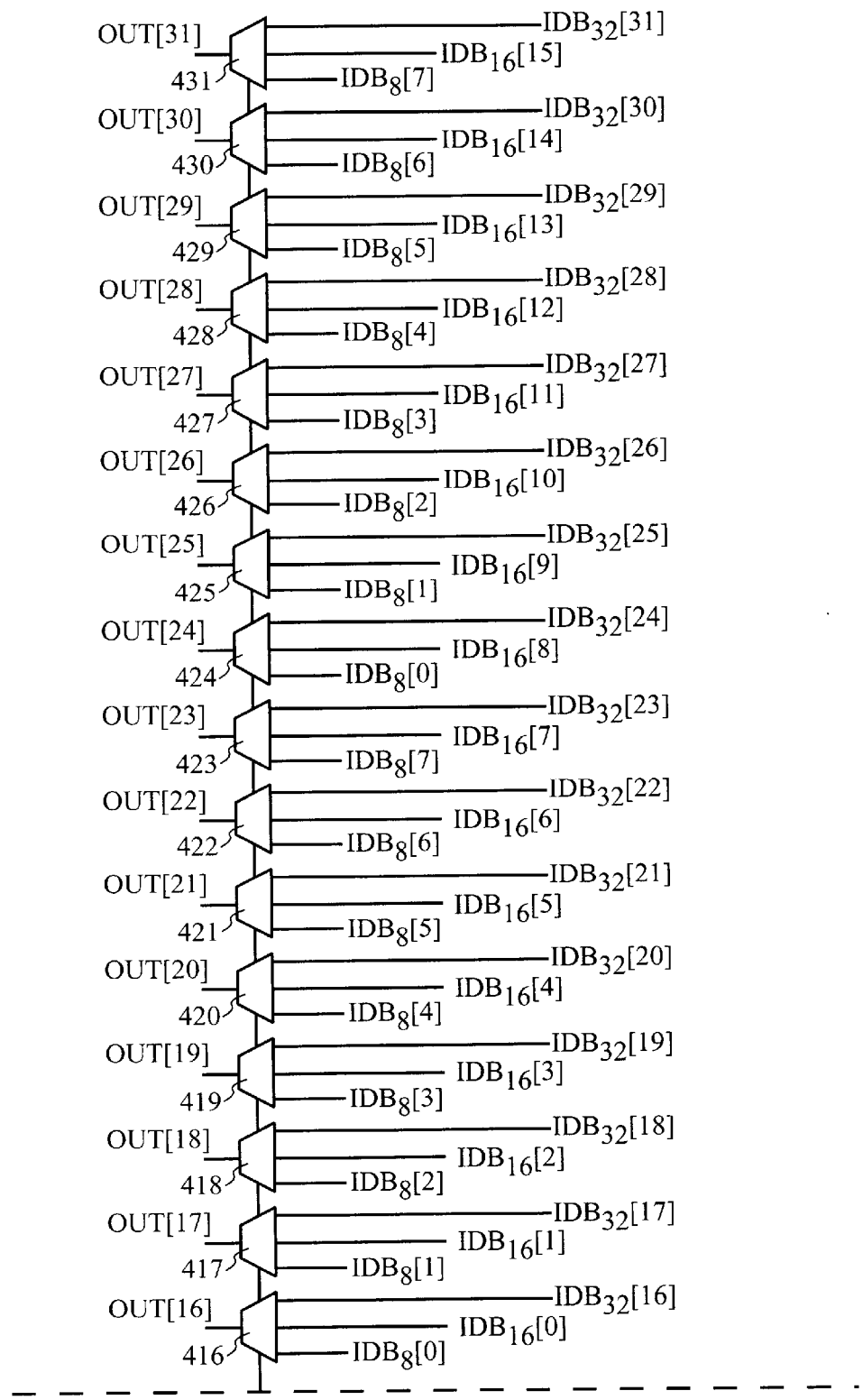

FIG. 4, which consists of FIGS. 4A and 4B, illustrates input multiplexer 9 of FIG. 2 in accordance with one embodiment of the present invention. Input multiplexer 9 includes thirty-two 3-to-1 multiplexers 400–431. The control input terminals of each of these multiplexers 400–431 are coupled to receive multiplexer control signals MC[1:0] from configuration state machine 15. The uppermost input terminals of multiplexers 431–400 are coupled to receive configuration data bits $IDB_{32}$[31:0], respectively. If multiplexer control signals MC[1:0] are representative of a first state, then multiplexers 431–400 pass the configuration data bits $IDB_{32}$[31:0] as output signals OUT[31:0].

The middle input terminals of multiplexers 431–416 are coupled to receive configuration data bits $IDB_{16}$[15:0], respectively. Input multiplexer 9 also includes connections (not shown) that route the configuration data bits $IDB_{16}$[15:0] to the middle input terminals of multiplexers 415–400, respectively. Thus, configuration data bits $IDB_{16}$

[15:0] are provided to input multiplexer 9 twice. If multiplexer control signals MC[1:0] are representative of a second state, then multiplexers 431–416 and multiplexers 415–400 pass the configuration data bits $IDB_{16}$[15:0] as output signals OUT[31:16] and OUT[15:0], respectively.

The lowermost input terminals of multiplexers 431–424 are coupled to receive configuration data bits $IDB_8$[7:0], respectively. Input multiplexer 9 also includes connections (not shown) that route the configuration data bits $IDB_8$[7:0] to the lowermost input terminals of multiplexers 423–416, respectively, to the lowermost input terminals of multiplexers 415–408, respectively, and to the lowermost input terminals of multiplexers 407–400, respectively. Thus, configuration data bits $IDB_8$[7:0] are provided to input multiplexer 9 four times. If multiplexer control signals MC[1:0] are representative of a third state, then multiplexers 431–424, multiplexers 423–416, multiplexers 415–408, and multiplexers 407–400 pass the configuration data bits $IDB_8$[7:0] as output signals OUT[31:24], OUT[23:16], OUT[15:8], and OUT[7:0], respectively.

In the foregoing manner, the configuration bit stream is routed through input multiplexer 9 to input register 7. The width of input register 7 is preferably the same as the maximum supported width of input data bus IDB. In the described embodiment, input register 7 has a width of 32 bits.

Figure 5:
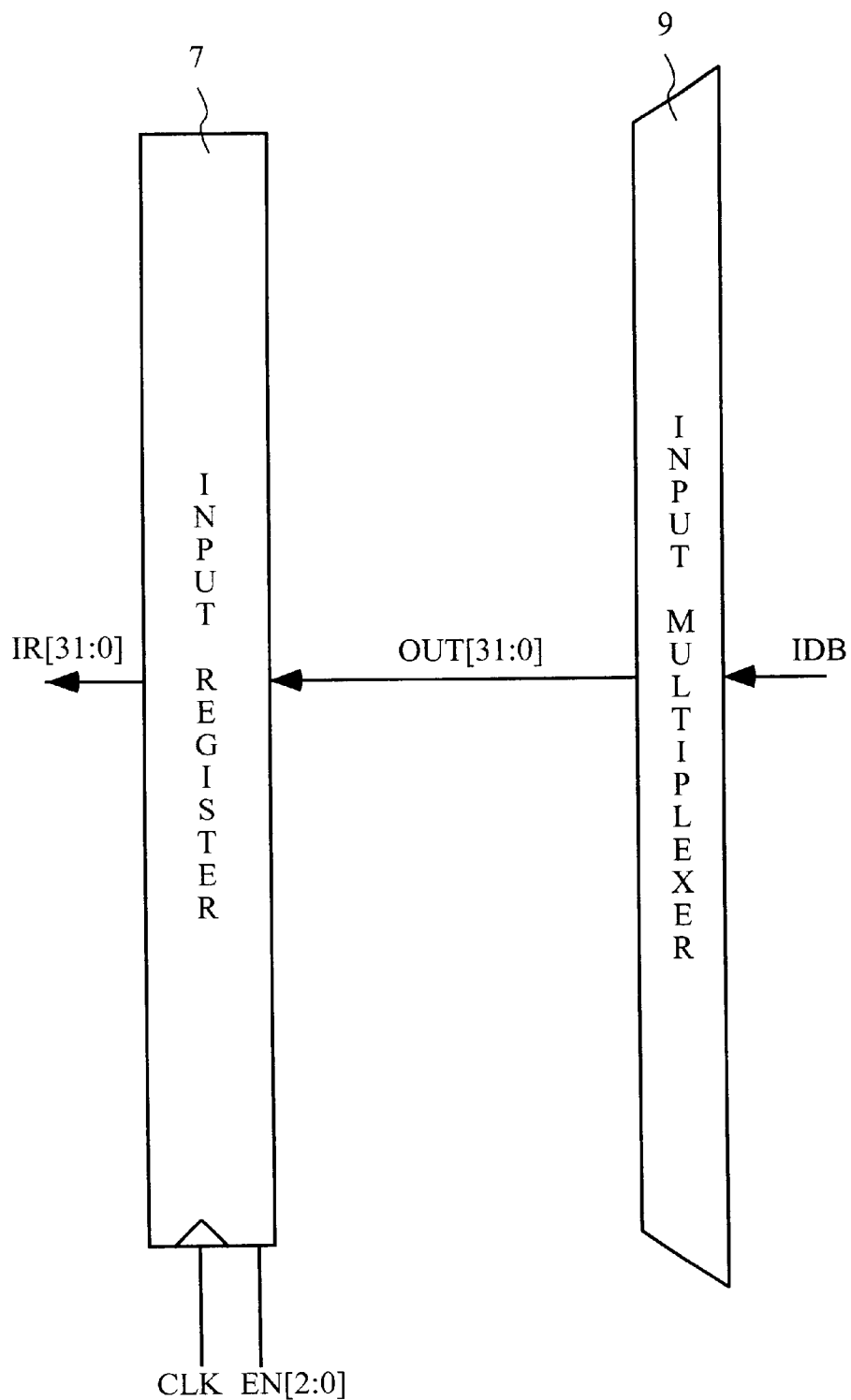
FIG. 5 is a circuit diagram illustrating an input multiplexer and an input register of the configuration circuit of FIG. 2 in accordance with one embodiment of the present invention.

FIG. 5 is a circuit diagram illustrating input register 7, which includes 32 input terminals and 32 output terminals. The 32 input terminals are coupled to receive the output signals OUT[31:0] from input multiplexer 9. The 32 output terminals provide output signals IR[31:0]. Input register 7 is controlled by a clock signal CLK and register enable signals EN[2:0] received from configuration state machine 15. The register enable signals EN[2:0], when asserted, enable various sets of the input terminals of input register 7. When the clock signal CLK is asserted, the signals on the enabled input terminals are loaded into input register 7. Table 1 summarizes the manner in which the output signals OUT [31:0] are loaded into input register 7 in response to the register enable signals EN[2:0].

TABLE 1

| EN[2:0] | Enabled Input Terminals of Input Register 7 |
|---|---|
| 000 | None |
| 001 | OUT[31:24] |
| 010 | OUT[23:16] |
| 011 | OUT[15:8] |
| 100 | OUT[7:0] |
| 101 | OUT[31:16] |
| 110 | OUT[15:0] |
| 111 | OUT[31:0] |

A 32-bit configuration data value is loaded into input register 7 by providing an enable signal EN[2:0] having a value of "111" and then asserting the clock signal CLK. A 32-bit configuration data value is thereby loaded in a single clock cycle.

A pair of 16-bit configuration data values are loaded into input register 7 as follows. A first 16-bit configuration data value is loaded into input register 7 by providing an enable signal EN[2:0] having a value of "101" and then asserting the clock signal CLK. A second 16-bit configuration data value is loaded into input register 7 by providing an enable signal EN[2:0] having a value of "110" and then asserting the clock signal CLK. A pair of 16-bit configuration data values are thereby loaded in two clock cycles. Note that the first 16-bit configuration data value must be applied to input multiplexer 9 during the first clock cycle, and that the second 16-bit configuration data value must be applied to input multiplexer 9 during the second clock cycle.

Four 8-bit configuration data values are loaded into input register 7 in a similar manner by providing enable signals EN[2:0] having values of "001", "010", "011", and "100", and asserting the clock signal CLK four times.

Regardless of the width of input data bus IDB, configuration data is loaded into input register 7 until all 32-bits of input register 7 have been loaded.

Figure 5A:
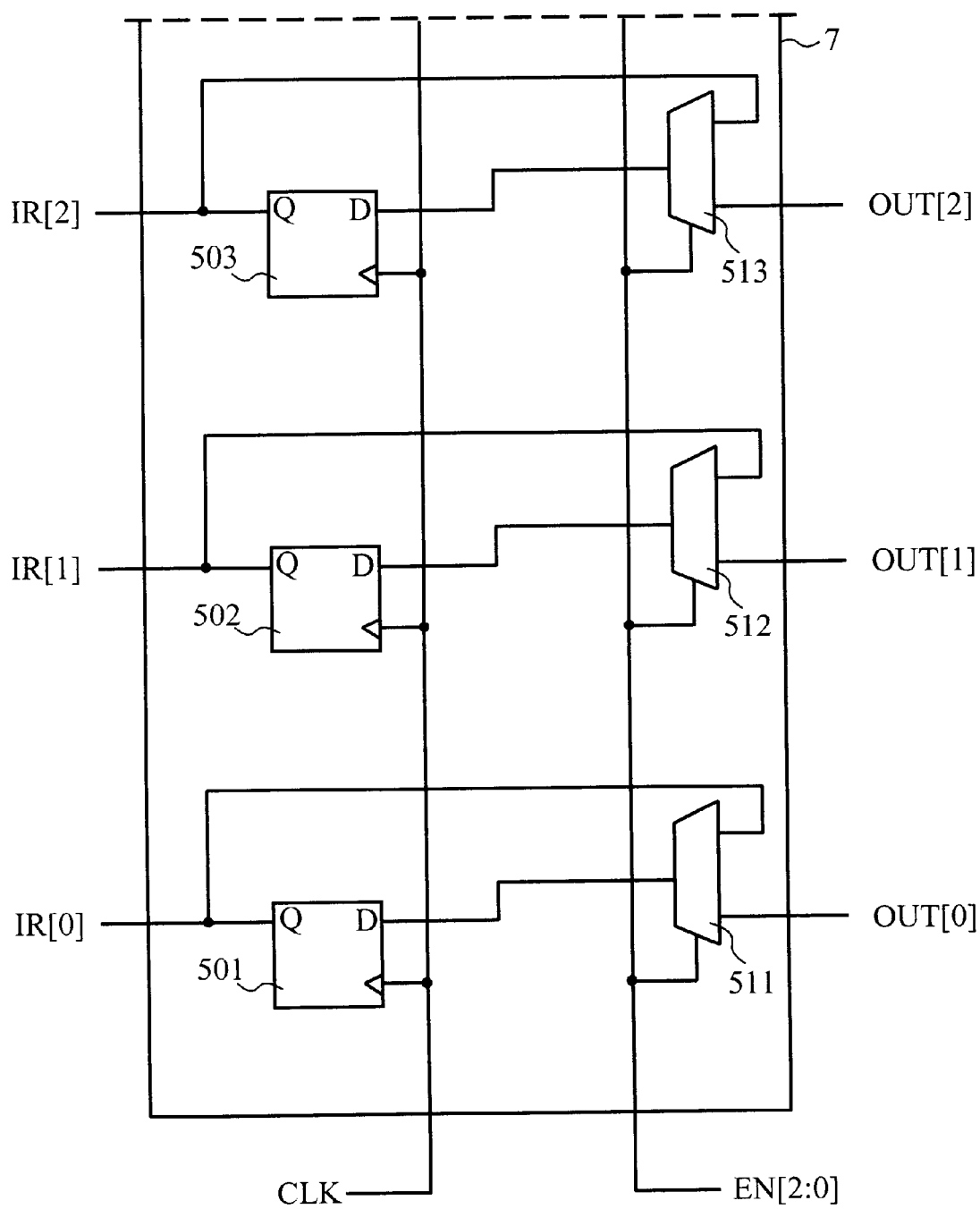
FIGS. 5A and 5B are circuit diagrams illustrating bit slices of an input register in accordance with two embodiments of the present invention.

FIG. 5A is a circuit diagram of three bit-slices of the least significant bits of input register 7 in accordance with one embodiment of the present invention. These bit slices include flip-flops 501–503 and multiplexers 511–513. When the enable signals EN[2:0] have values of 100, 110 or 111, multiplexers 511–513 pass the signals OUT[0:2] to flip-flops 501–503, respectively. For all other enable signals, multiplexers 511–513 route the last values stored by flip-flops 501–503 to the input terminals of flip-flops 501–503, respectively. The other 29 bit slices of input register 7 are identical to the illustrated bit slices (other than in their response to enable signals EN[2:0]), and operate in accordance with Table 1.

In another embodiment of the present invention, the input data bus IDB can also be configured to have a width of one bit. In this embodiment, input register 7 is modified to have a mode in which input register 7 operates as a shift register. Each configuration data bit is sequentially shifted into input register 7 from the least significant bit position of the register until 32 configuration data values have been loaded into input register 7.

Figure 5B:
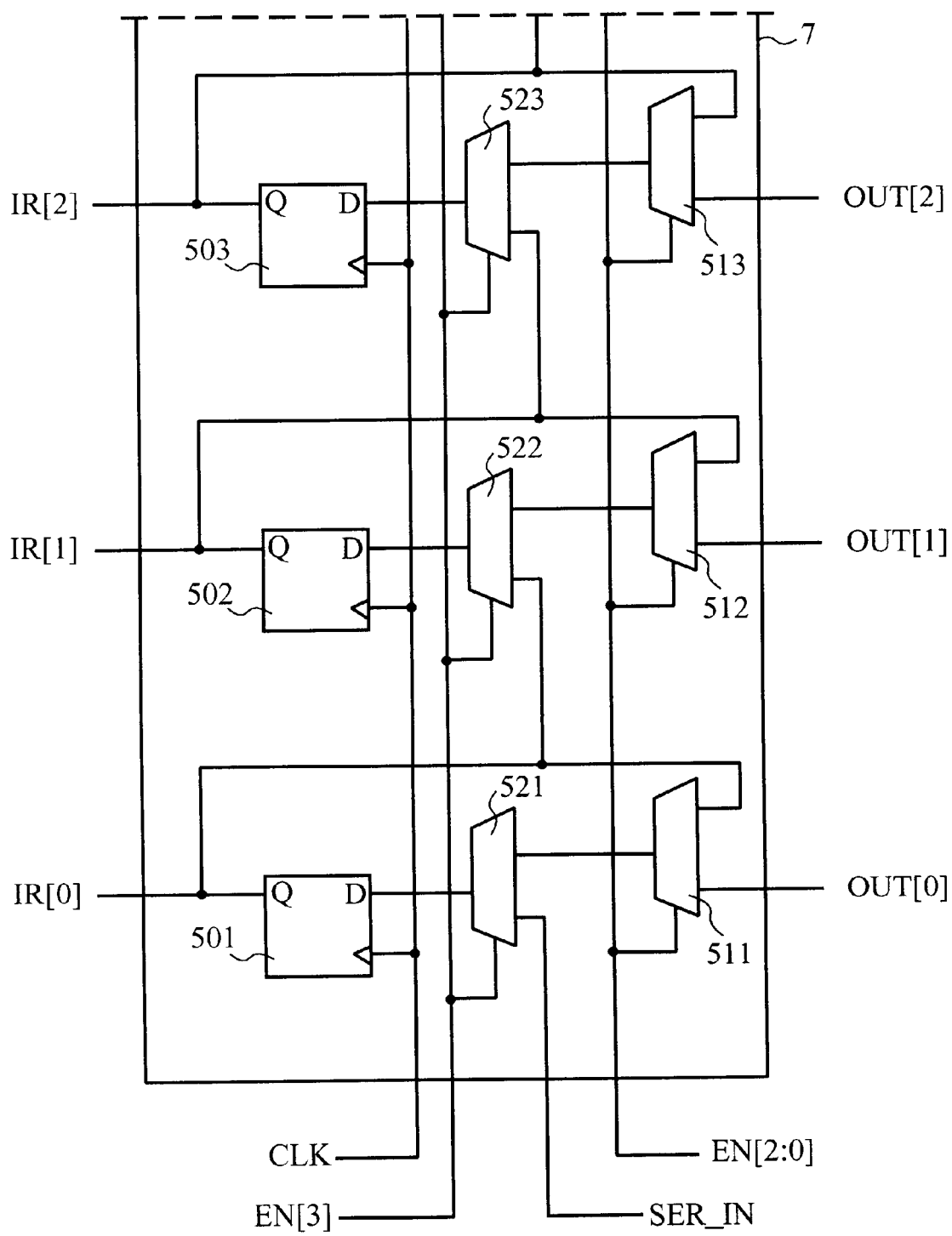

FIG. 5B is a circuit diagram of three bit-slices of the least significant bits of input register 7 that enables serial operation in accordance with one embodiment of the present invention. Because the circuitry of FIG. 5B is similar to the circuitry of FIG. 5A, similar elements in FIGS. 5A and 5B are labeled with similar reference numbers. Thus, the bit slices of FIG. 5B include flip-flops 501–503, multiplexers 511–513 and multiplexers 521–523. Multiplexers 521–523 are controlled by an additional enable signal EN[3]. When the enable signal EN[3] has a first logic value (e.g., logic low), multiplexers 521–523 pass the output signals received from multiplexers 511–513, respectively, to flip-flops 501–503, respectively. Under these conditions, the input register of FIG. 5B operates in the same manner as the input register of FIG. 5A.

However, when the enable signal EN[3] has a second logic value (e.g., logic high), multiplexer 521 routes an initial serial input data bit SER_IN[x] to the input terminal of flip-flop 501. During the next clock cycle, the serial input data bit SER_IN[x] is routed through multiplexer 522 to the input terminal of flip-flop 502. Also during this clock cycle, the next serial input data bit SER_IN[y] is routed through multiplexer 521 and into flip-flop 501. This process continues until 32 configuration data bits have been loaded into input register 7.

In one embodiment, the portion of configuration state machine 15 that controls input multiplexer 9, input register 7, and shadow input register 3 is implemented separately from the rest of configuration state machine 15.

Returning now to FIG. 2, when input register 7 is full, configuration state machine 15 initiates a load from input register 7 to shadow input register 3 by asserting a clock signal on the clock input terminal of shadow input register 3. Input register 7 provides a 32-bit output signal IR[31:0] to shadow input register 3. Once the contents of input register 7 have been loaded into shadow input register 3, configuration state machine 15 begins overwriting the configuration data in input register 7 with new configuration data.

At this point in the configuration process, 32 bits of configuration data are ready in shadow input register 3 for loading into configuration register 4. Shadow input register 3 provides a 32-bit output signal on bus S[31:0].

In the present embodiment, the FPGA employs an array of configurable logic blocks (CLBs) arranged in tiles, as well as input/output blocks (IOBs) located around the periphery of the FPGA. CLBs and IOBs are collectively referred to as configurable blocks. Each 1-bit wide slice of configuration memory cells that extends along an entire column of configurable blocks is referred to as a configuration memory frame. (In another embodiment, a configuration memory frame comprises only a portion of a column of configurable blocks.) In the described embodiment, each configurable block is 18 configuration memory cells tall. As a result, the number of configuration data bits in a configuration memory frame is a multiple of 18. However, in the present embodiment shadow input register 3 is 32 bits wide, and therefore the number of bits is not a multiple of 18. It is therefore necessary to alter the width of the data provided by shadow input register 3 to accommodate the width of the configuration memory frames.

Configuration register 4 is a shift register that includes a set of 18 registers for each row of configurable blocks in the FPGA. For example, configuration register 4 includes register sets 13A and 13B. The 18 configuration data values loaded into register set 13A are used to configure the first row of configurable blocks, and the 18 configuration data values loaded into register set 13B are used to configure the last row of configurable blocks. Eighteen of the 32 configuration data values stored in shadow input register 3 are routed to configuration pre-load bus 5. From configuration pre-load bus 5, these 18 configuration data values are shifted into register set 13B under the control of configuration state machine 15. The 14 bits that are not routed to configuration pre-load bus 5 need not be completely wasted, as some of these 14 bits can be used for accuracy testing.

FIG. 6 (inset on FIG. 2) is a detailed diagram of a 1-bit storage device 14 in register set 13B. All of the 1-bit storage devices in configuration register 4 are substantially identical to storage device 14. In the described embodiment, storage device 14 is a D flip-flop having a D input terminal coupled to receive a configuration data value (from configuration pre-load bus 5 or the Q output terminal of a lower adjacent register), a Q output terminal coupled to shadow configuration register 8 and a D input terminal of an upper adjacent register, and a clock input terminal (shown as a triangle in FIG. 6) coupled to configuration state machine 15. To load the 18 configuration data values on pre-load bus 5 into configuration register 4, configuration state machine 15 asserts a clock signal on the clock input terminals of the storage devices in configuration register 4. Each time a new set of 18 configuration data values is provided on pre-load bus 5, configuration state machine 15 clocks the configuration register, thereby shifting the configuration data values up toward register set 13A. This cycle continues until configuration register 4 is full of configuration data values. In one embodiment, configuration register 4 is divided into a plurality of configuration sub-registers that are laid out across a corresponding plurality of logic blocks, in order to reduce the distance between the 1-bit storage devices in configuration register 4 and the corresponding configurable blocks.

When configuration register 4 is full, configuration state machine 15 asserts a clock signal on the clock input terminal of shadow configuration register 8, thereby loading the configuration data values stored in configuration register 4 into shadow configuration register 8. Shadow configuration register 8 has the same number of bits as configuration register 4. After shadow configuration register 8 has been loaded, configuration state machine 15 can begin loading new configuration data values into configuration register 4 (for programming the next column of configurable blocks). Therefore, the configuration process does not have to pause while the frame of configuration data is written to a configuration memory frame. Instead, this write step can take as long as it takes configuration register 4 to be re-loaded with the next frame of configuration data.

Shadow configuration register 8 is coupled to each of the configuration memory frames $F_0$—$F_N$ of configuration memory array 1 as illustrated. Shadow configuration register 8 drives the frame of configuration data across the device to where it is clocked into a selected configuration memory frame. A frame of configuration data is written from shadow configuration register 8 to a configuration memory frame $F_0$—$F_N$ of configuration memory array 1 when a configuration clock goes high and the corresponding enable signal (EN) is active. Configuration state machine 15 selects one of the configuration memory frames $F_0$–$F_N$ by causing an enable signal to be applied to one of the configuration memory frames. In the described embodiment, the enable signal is generated as follows. Configuration state machine 15 provides a clock signal that increments frame counter 12. The count value generated by frame counter 12 is provided to input terminals of comparators $10_0$–$10_N$. The other input terminals of comparators $10_0$–$10_N$ are coupled to frame number registers $11_0$–$11_N$, respectively. Each of frame number registers $11_0$–$11_N$ is programmed to provide a unique address to its associated comparator. When the count value of frame counter 12 matches the contents of a particular frame number register, the associated comparator asserts an enable signal. This enable signal is provided to an associated configuration memory frame. The addressing of configuration memory frames is described in more detail by Ong et al. in U.S. Pat. No. 5,821,772, entitled "programmable Address Decoder for Programmable Logic Device", which is incorporated by reference. After the enable signal is asserted, configuration state machine 15 asserts a clock signal on the clock input terminals of each configuration memory frame. As a result, the configuration data values are written to the selected configuration memory frame.

In one embodiment, the frame number addresses are hard coded instead of being stored in frame number registers $11_0$–$11_N$. When frame number registers $11_0$–$11_N$ are used, each register has to be initialized before configuration can commence. Ong et al. in U.S. Pat. No. 5,821,772, referenced above, describes how this initialization is done by the first block of writes to the device. However, initialization could also be performed by a reset signal initializing each register to a unique value. In one variation, a plurality of frame number registers $11_0$–$11_N$ are loaded with the same addresses, thereby enabling the same data to be written to many configuration memory frames at the same time. This feature helps decrease the time needed to test a device.

Second Embodiment of the Invention

Figure 7:
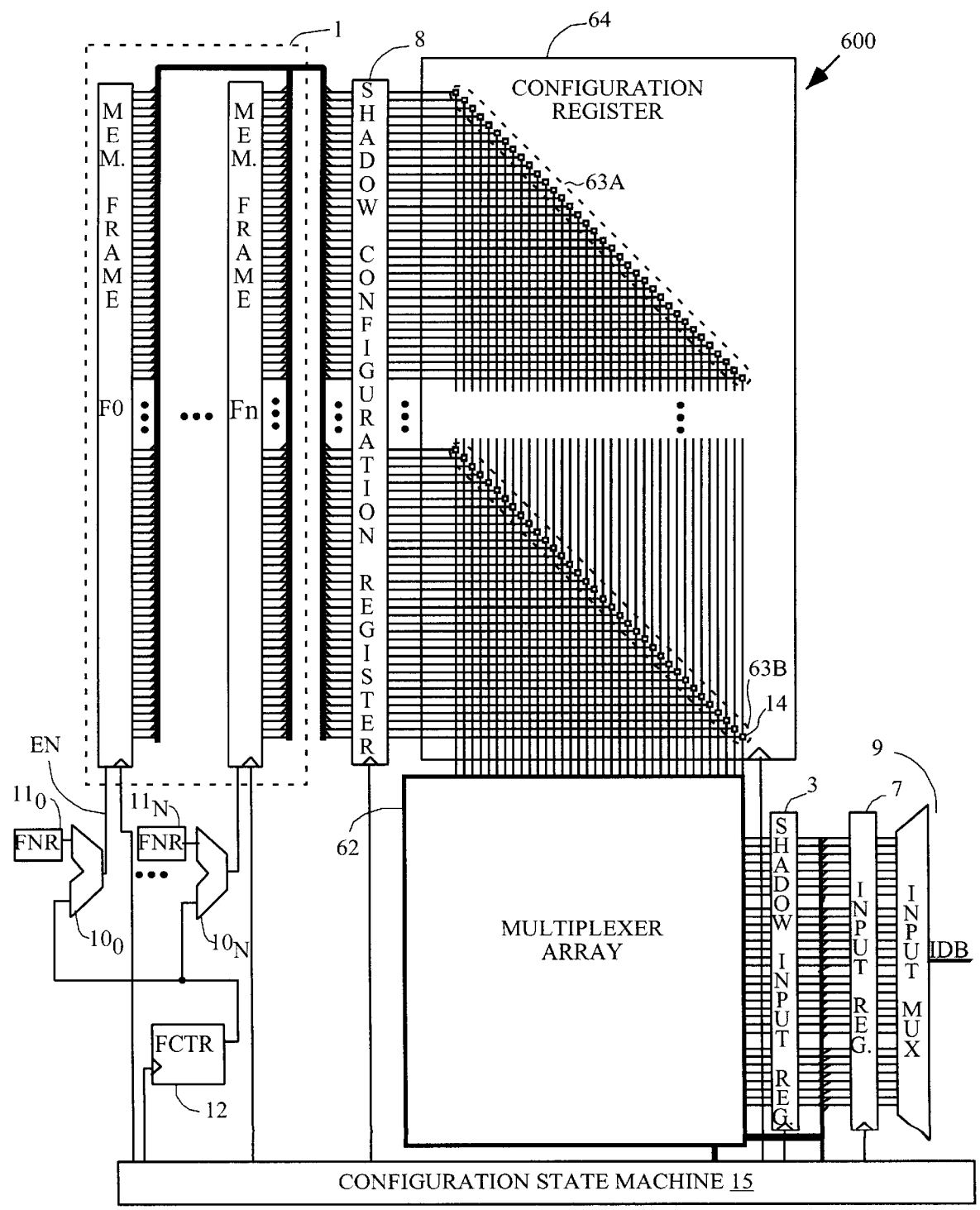
FIG. 7 is a circuit diagram of a configuration circuit used to configure an FPGA in accordance with another embodiment of the present invention.

FIG. 7 illustrates a configuration circuit 600 used to configure an FPGA in accordance with another embodiment of the present invention. Similar elements in FIGS. 2 and 7 are labeled with similar reference numbers. Thus, circuitry 600 includes input multiplexer 9, input register 7, shadow input register 3, shadow configuration register 8, configuration memory array 1, frame number registers $11_0$–$11_N$, comparators $10_0$–$10_N$, frame counter 12, and configuration state machine 15. In configuration circuit 600, configuration pre-load bus 5 of circuit 200 is replaced by multiplexer array 62. In addition, configuration register 4 of circuit 200 is replaced by configuration register 64. Configuration register 64 includes 36-bit register sets 63A and 63B (compared to 18-bit register sets 13A and 13B in configuration register 4). The width of configuration register 64 in this embodiment is 36 bits, because 36 is the smallest whole multiple of the CLB memory cell height (18 bits) that is greater than the maximum supported input data bus width of 32 bits. As described in more detail below, configuration state machine 15 of FIG. 7 is more complicated than configuration state machine 15 of FIG. 2.

Circuit 200 of FIG. 2 provides a simple solution to the requirement for resolving incompatible bus widths between shadow input register 3 and configuration register 4. The solution of FIG. 2 is relatively easy to implement and avoids the need to deal with bit stream compatibility requirements. However, the configuration bit stream is almost twice as large as it needs to be and the bus bandwidth is not fully utilized. The embodiment illustrated in FIG. 7 is more complex, but does not require unnecessary bits in the configuration bit stream, thereby fully utilizing the bus bandwidth.

In the embodiment of FIG. 7, multiplexer array 62 is coupled to receive incoming configuration data from both 32-bit input register 7 and 32-bit shadow input register 3. The input terminals of shadow input register 3 are driven from the output terminals of input register 7. Every configuration data word loaded into input register 7 is passed on to shadow input register 3 in the subsequent load cycle.

Multiplexer array 62 receives 64 configuration data bits from 32-bit input register 7 and 32-bit shadow input register 3. As described in more detail below, configuration state machine 15 controls multiplexer array 62 to route 36 of these 64 configuration data bits to configuration register 64. Configuration state machine 15 then provides a clock signal to configuration register 64, thereby causing the 36 selected configuration data bits to be loaded into configuration register 64. This loading operation proceeds in the manner described above in connection with configuration circuit 200. After configuration register 64 has been filled with configuration data, this configuration data is loaded into configuration memory array 1 in the manner described above in connection with configuration circuit 200.

Figure 8B:
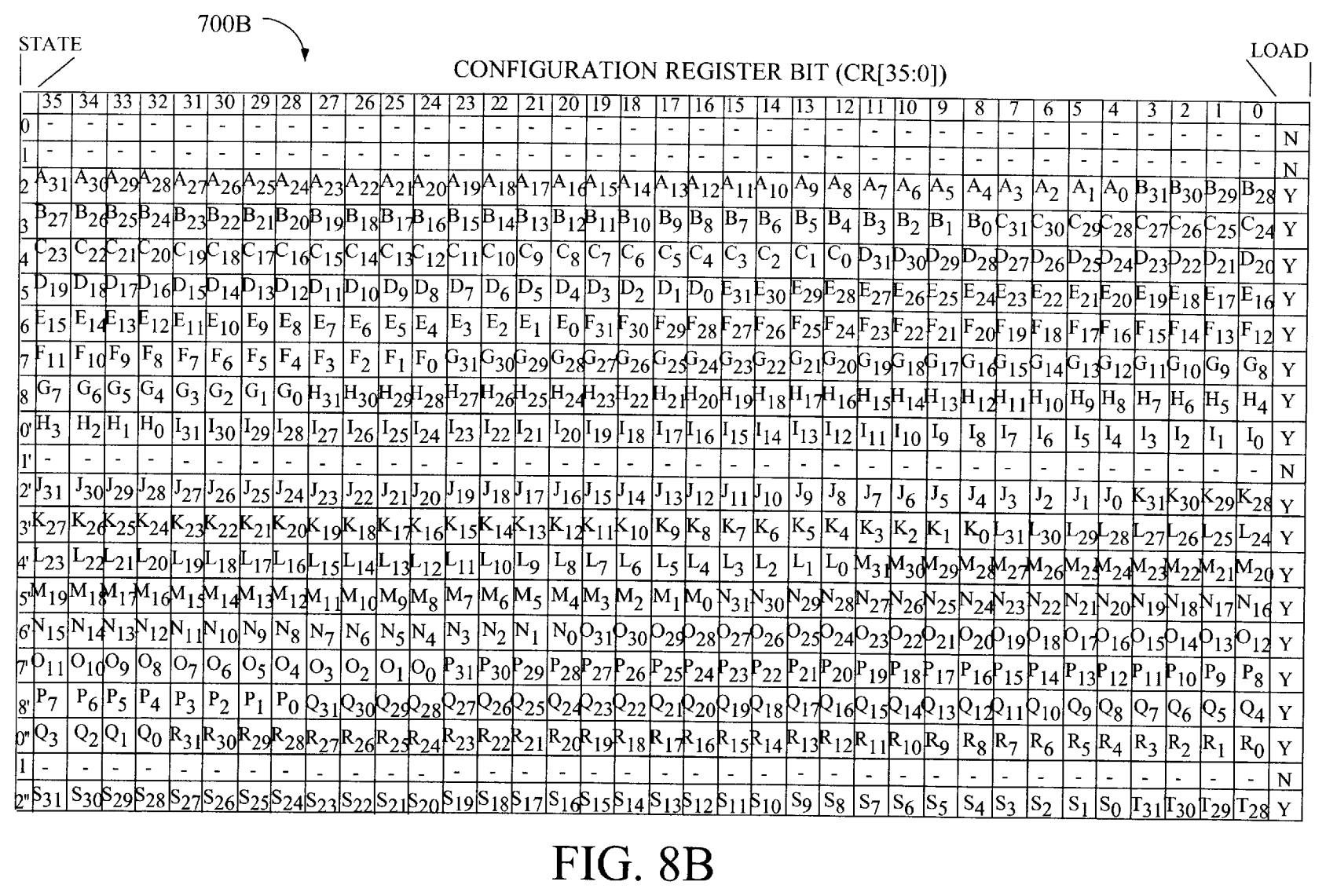

Multiplexer array 62 is now described. FIGS. 8A and 8B illustrate state tables 700A and 700B, respectively. State table 700A defines the manner in which input register 7 and shadow input register 3 are loaded with 32-bit configuration data values A[31:0] to U[31:0] during a first 21 states. State table 700B defines the manner in which multiplexer array 62 routes these configuration data values during these 21 states. Note that state tables 700A and 700B define a 9-state repeated process that is implemented under the control of configuration state machine 15. (State machines are well known in the art of IC design; therefore, state machine 15 is not described in detail.)

As will become apparent in view of the subsequent disclosure, this 9-state process requires each bit of configuration register 64 to be fed by an 8-to-1 multiplexer. Thus, multiplexer array 62 includes thirty-six 8-to-1 multiplexers (not shown). These multiplexers are implemented in accordance with state table 700B. The 36 bits provided to configuration register 64 are designated CR[35:0].

During the initial state (State 0), a first 32-bit configuration data value A[31:0] is loaded into input register 7. During the next state (State 1), all 32-bits of this configuration data value A[31:0] are loaded from 32-bit input register 7 to shadow input register 3, and a second configuration data value B[31:0] is loaded into input register 7. Also during State 1, the configuration data values A[31:0] and B[31:0] begin to propagate through multiplexer array 62. Note that configuration register 64 is not clocked during State 0 or State 1, as valid data is not yet available from multiplexer array 62. This lack of a clock pulse is indicated by the letter "N" appearing in the "Load" column at the right edge of FIG. 8B.

During the next state (State 2), multiplexer array 62 provides the configuration data values A[31:0] and B[31:28] to configuration register 64. During State 2, these 36 configuration data values are loaded into configuration register 64 as a 36-bit configuration data word CR[35:0]. This clocking step is indicated by the letter "Y" appearing in the "Load" column at the right edge of FIG. 8B. Also during State 2, the second configuration data value B[31:0] is loaded from input register 7 to shadow input register 3. In addition, a third configuration data value C[31:0] is loaded into input register 7.

During the next state (State 3), multiplexer array 62 provides the configuration data values B[27:0] and C[31:24] to configuration register 64. During State 3, these 36 configuration data values are loaded into configuration register 64 as a 36-bit configuration data word CR[35:0]. Also during State 3, the third configuration data value C[31:0] is loaded from input register 7 to shadow input register 3. In addition, a fourth configuration data value D[31:0] is loaded into input register 7.

The above-described sequence is continued in the manner defined by state tables 700A and 700B. Note that during State 8, a ninth configuration data value I[31:0] is loaded into input register 7. Also note that during the next state (State 0'), this entire ninth configuration data value I[31:0] is loaded into configuration register 64 (along with the remaining bits from the eighth configuration data value H[31:0]). Thus, at the end of State 0', nine 32-bit configuration data values have been loaded into configuration register 64 as eight 36-bit configuration data values. Consequently, all of the configuration data bits are used (none are wasted). During the next state (State 1'), configuration register 64 is not loaded because it takes an additional cycle to present the next two configuration data values (J[31:0] and K[31:28]) to multiplexer array 62.

FIG. 8B clearly identifies the 9 inputs to each of the thirty-six 8-to-1 multiplexers present in multiplexer array 62. For example, the multiplexer that provides bit CR[35] of configuration register 64 is coupled to bit 31 of input register 7 (State 2) or bits 27, 23, 19, 15, 11, 7, and 3 of shadow input register 3 (States 3, 4, 5, 6, 7, 8, and 0', respectively). The thirty-six 8-to-1 multiplexers of multiplexer array 62 can be efficiently laid out as described below with reference to FIGS. 12–14.

Figure 9:
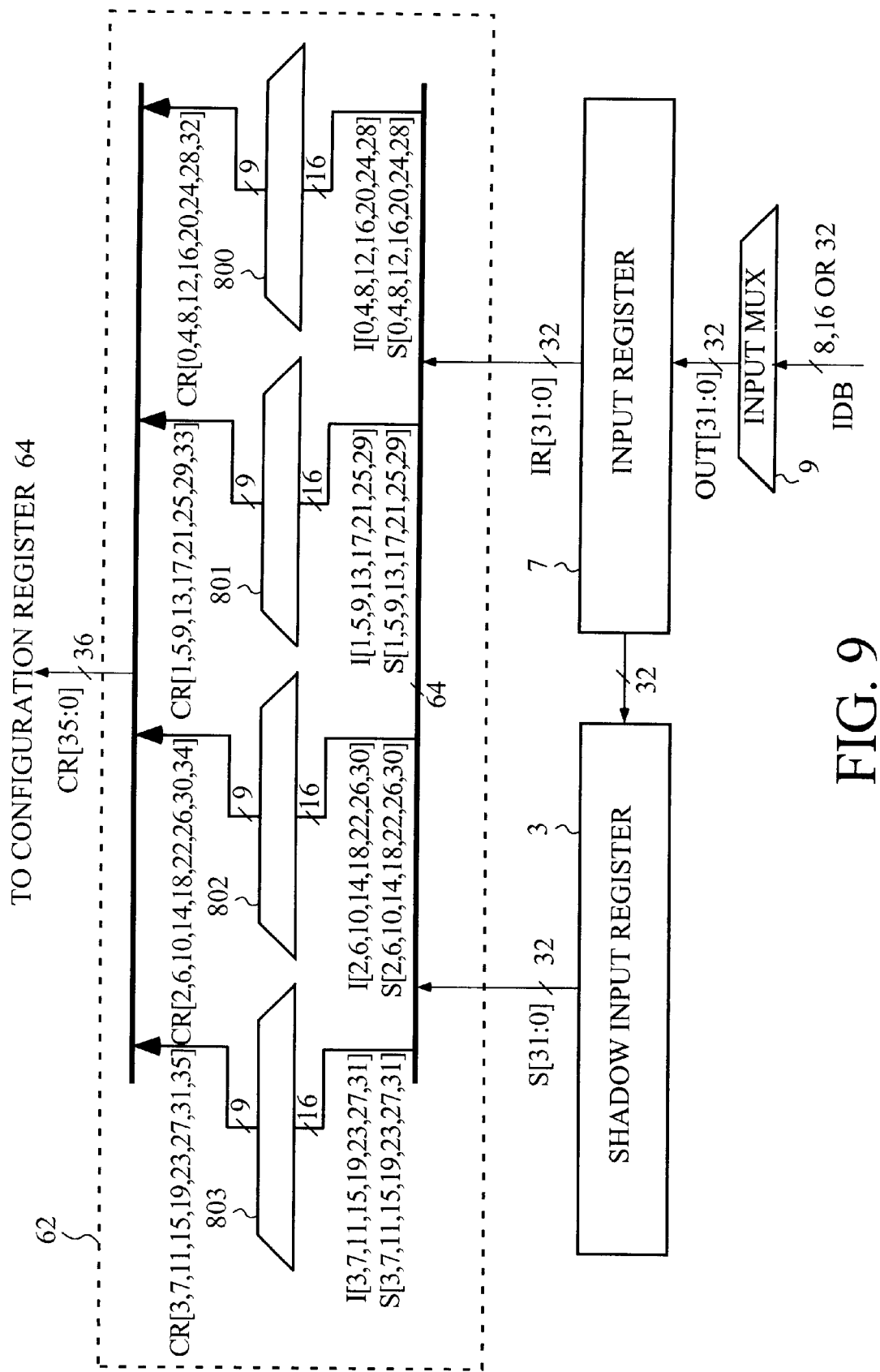
FIG. 9 is a circuit diagram of the multiplexer array and input circuitry of the configuration circuit of FIG. 7 in accordance with one embodiment of the present invention.
Figure 10A:
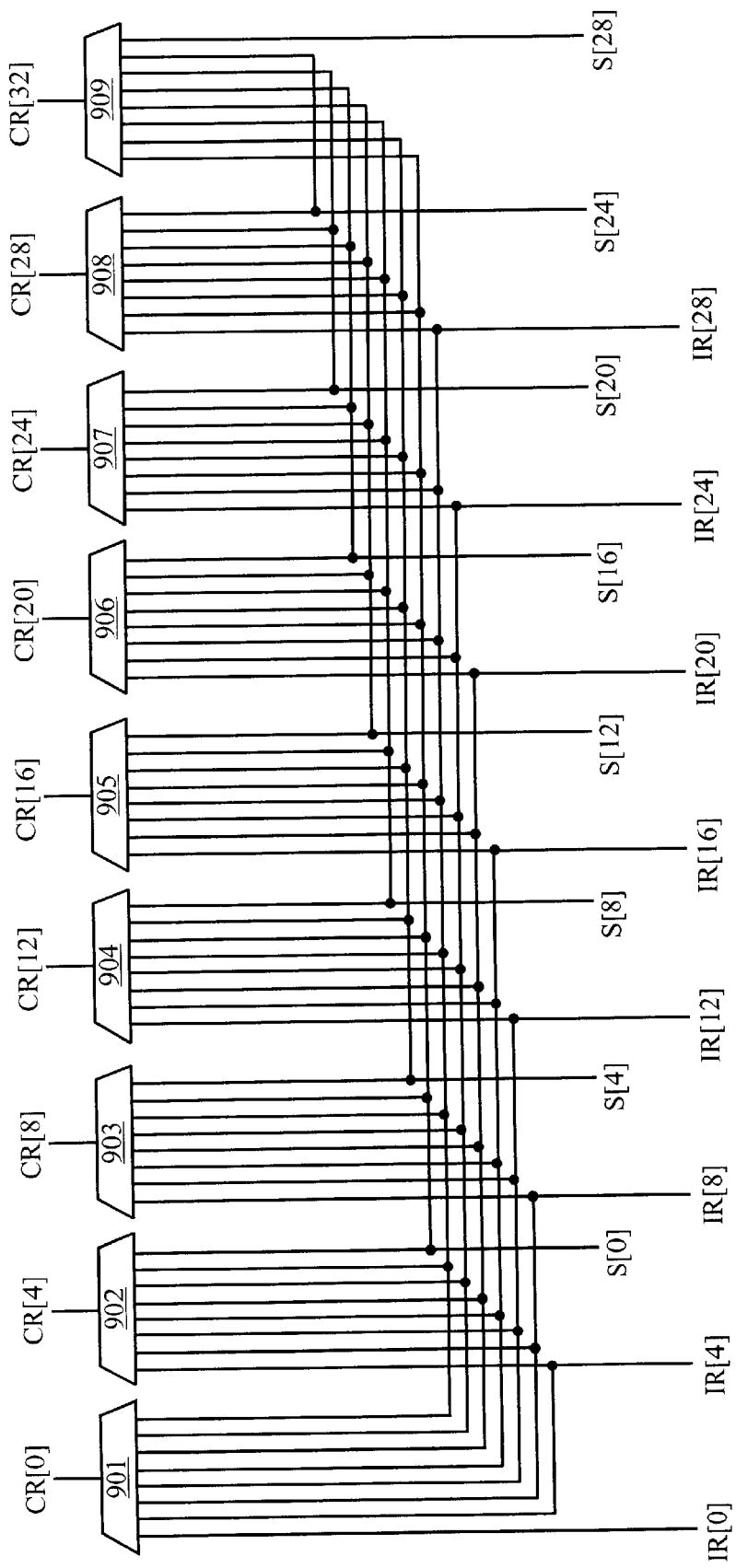
FIGS. 10A, 10B, 10C, and 10D are circuit diagrams of multiplexers that make up the multiplexer array of FIG. 9 in accordance with one embodiment of the present invention.
Figure 10B:
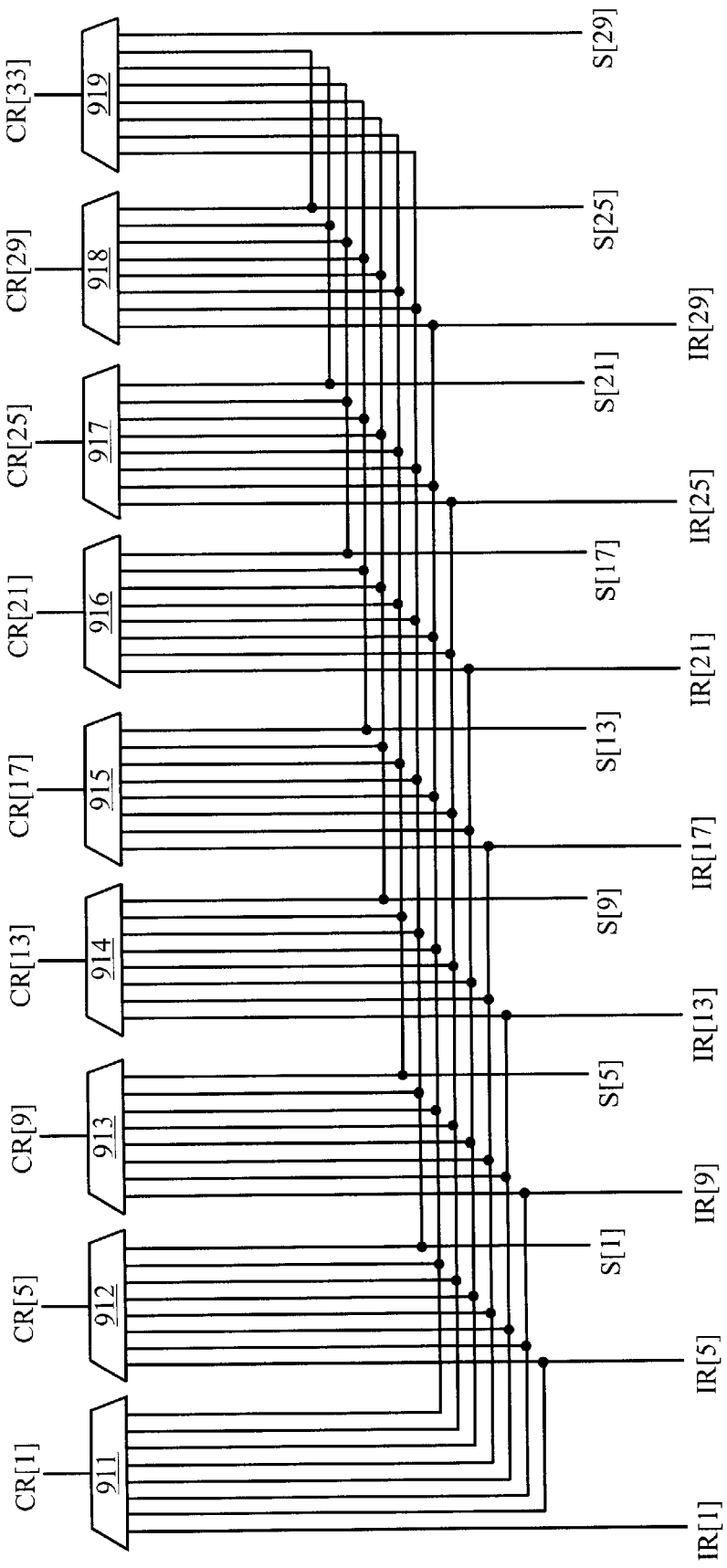
Figure 10C:
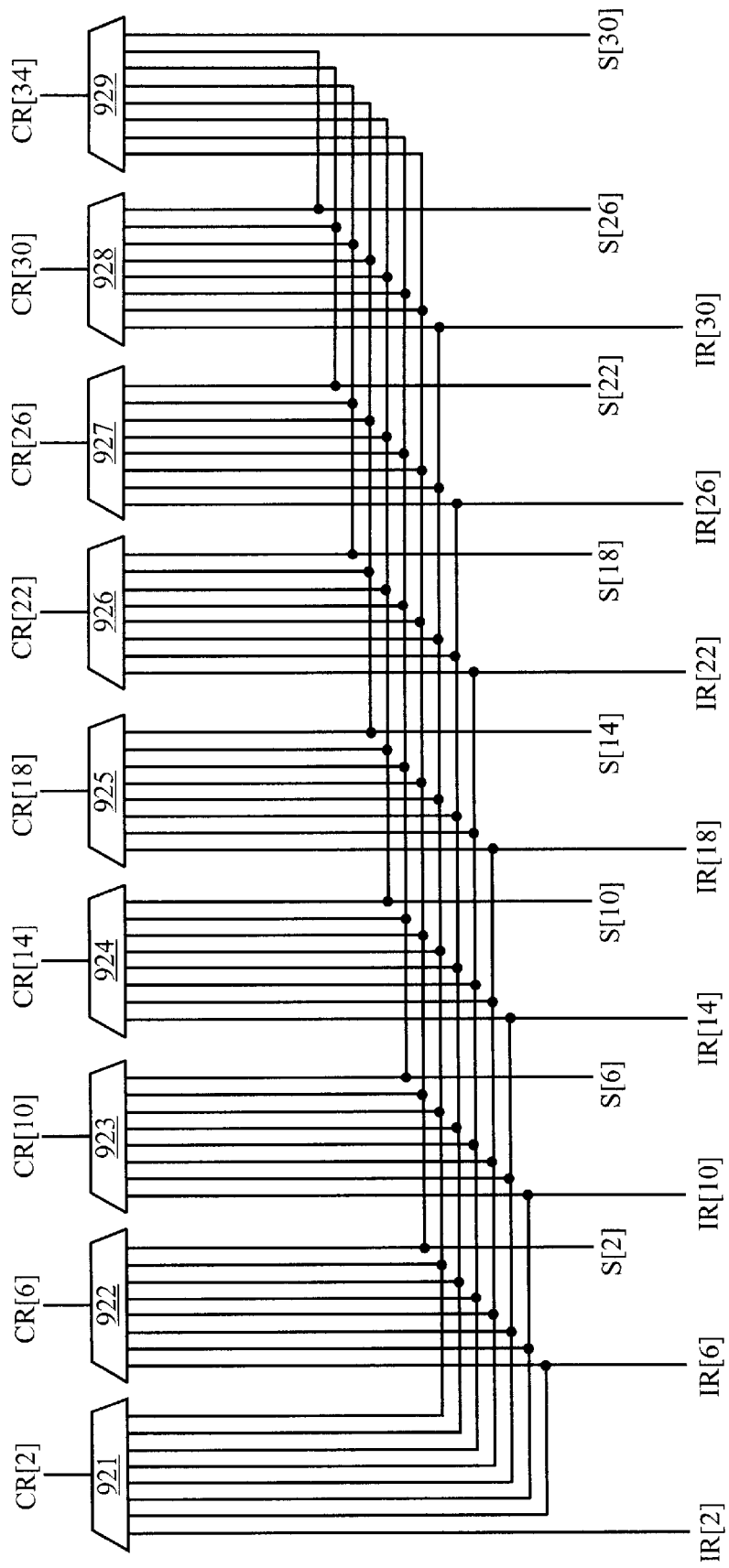
Figure 10D:
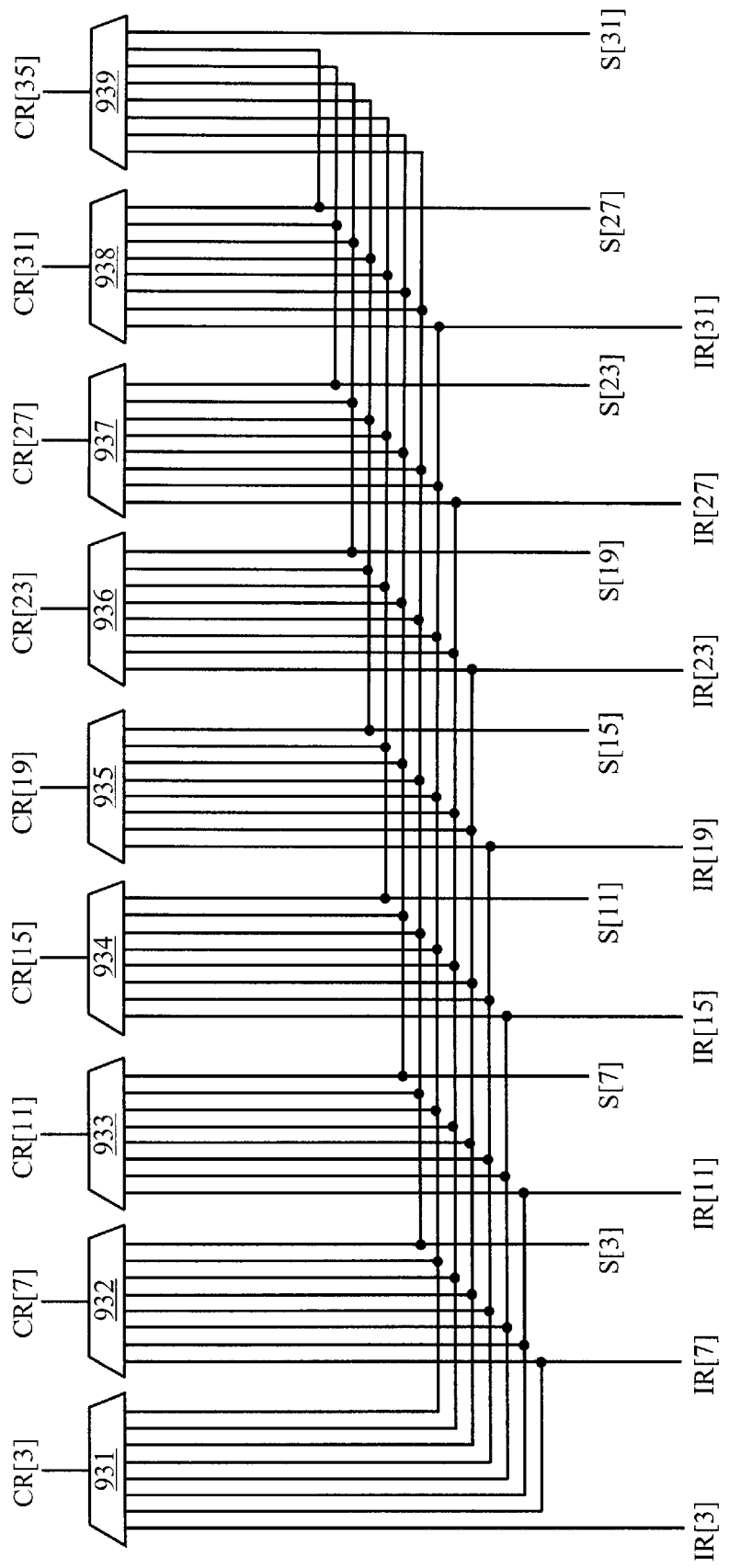

FIG. 9 is a circuit diagram of multiplexer array 62 in accordance with one embodiment of the present invention. Multiplexer array 62 includes four 16-to-9 multiplexers 800–803. As described in more detail below, each of 16-to-9 multiplexers 800–803 consists of nine 8-to-1 multiplexers. Multiplexers 800–803 are laid out in a compact manner, thereby enabling the efficient implementation of multiplexer array 62.

As described above, the 32-bit configuration data values are provided by shadow input register 3 and input register 7 on busses S[31:0] and IR[31:0], respectively. (The terms "S[31:0]" and "IR[31:0]" are used herein to describe both the corresponding busses and the signals carried on the busses.) The bits of these configuration data values S[31:0], IR[31:0] are provided to the input terminals of multiplexers 800–803 as set forth below in Table 2 (and in FIG. 9).

TABLE 2

| Multiplexer | Input Signals |
| --- | --- |
| 800 | IR[0, 4, 8, 12, 16, 20, 24, 28] |
|  | S[0, 4, 8, 12, 16, 20, 24, 28] |
| 801 | IR[1, 5, 9, 13, 17, 21, 25, 29] |
|  | S[1, 5, 9, 13, 17, 21, 25, 29] |
| 802 | IR[2, 6, 10, 14, 18, 22, 26, 30] |
|  | S[2, 6, 10, 14, 18, 22, 26, 30] |
| 803 | IR[3, 7, 11, 15, 19, 23, 27, 31] |
|  | S[3, 7, 11, 15, 19, 23, 27, 31] |

Thus, each of multiplexers 800–803 receives every fourth bit of configuration data values S[31:0] and IR[31:0].

As described above, the 36-bit configuration data values routed from multiplexer array 62 to configuration register 64 are labeled CR[35:0]. The bits of these configuration data values CR[35:0] are routed from multiplexers 800–803 to configuration register 64 as set forth below in Table 3 (and in FIG. 9).

TABLE 3

| Multiplexer | Output Signals |
| --- | --- |
| 800 | CR[0, 4, 8, 12, 16, 20, 24, 28, 32] |
| 801 | CR[1, 5, 9, 13, 17, 21, 25, 29, 33] |
| 802 | CR[2, 6, 10, 14, 18, 22, 26, 30, 34] |
| 803 | CR[3, 7, 11, 15, 19, 23, 27, 31, 35] |

Thus, each of multiplexers 800–803 provides every fourth bit of configuration data value CR[35:0]. Multiplexers 800–803 are controlled by configuration state machine 15. As described in more detail below, each of multiplexers 800–803 shares the same eight control lines. As a result, configuration state machine 15 controls the entire multiplexer array 62 using only eight control signals, further contributing to the efficiency of multiplexer array 62.

FIGS. 10A, 10B, 10C, and 10D are circuit diagrams of multiplexers 800, 801, 802, and 803, respectively, in accordance with the present embodiment. Each of 16-to-9 multiplexers 800–803 includes nine 8-to-1 multiplexers. More specifically, multiplexers 800, 801, 802 and 803 include multiplexers 901–909, 911–919, 921–929, and 931–939, respectively. Multiplexers 901–909, 911–919, 921—929, and 931–939 are coupled to receive configuration data values IR[31:0] and S[31:0] as illustrated.

Each of multiplexers 901–909, 911–919, 921–929, and 931–939 has eight input terminals. The rightmost input terminal of each multiplexer is defined as the first input terminal of the multiplexer, and the leftmost input terminal of each multiplexer is defined as the eighth input terminal of the multiplexer. The intermediate input terminals are defined as consecutive input terminals between the rightmost and leftmost input terminals (e.g., the third input terminal from the right is the third input terminal).

Each of multiplexers 901–909, 911–919, 921–929, and 931–939 is controlled by the same eight control signals CTRL[7:0] (not shown). These eight control signals CTRL[7:0] are controlled by configuration state machine 15 to have eight different states. In each of the eight states, one and only one of the control signals CTRL[7:0] is asserted. (In another embodiment, three control signals are encoded to select the eight different states.) When the first control signal CTRL[0] is asserted, each of multiplexers 901–909, 911–919, 921–929, and 931–939 passes the input signal applied to its first input terminal. When the eighth control signal CTRL[7] is asserted, each of multiplexers 901–909, 911–919, 921–929, and 931–939 passes the input signal applied to its eighth input terminal. Table 4 summarizes the manner in which multiplexers 901–909, 911–919, 921–929, and 931–939 operate in response to control signals CTRL[7:0].

TABLE 4

| CTRL[7:0] | Enabled Input Terminal of Multiplexers 901–909, 911–919, 921–929, 931–939 |
| --- | --- |
| 0000 0001 | 1st Input Terminal (rightmost) |
| 0000 0010 | 2nd Input Terminal |
| 0000 0100 | 3rd Input Terminal |
| 0000 1000 | 4th Input Terminal |
| 0001 0000 | 5th Input Terminal |
| 0010 0000 | 6th Input Terminal |
| 0100 0000 | 7th Input Terminal |
| 1000 0000 | 8th Input Terminal (leftmost) |

Figure 11:
FIG. 11 is a state table that illustrates the manner in which the multiplexers of FIGS. 10A–10D route configuration data values in response to control signals.

FIG. 11 is a table 1111 that illustrates the manner in which multiplexers 800–803 route the configuration data values IR[31:0] and S[31:0] in response to the control signals CTRL[7:0]. Note that, as expected, multiplexers 800–803 route the configuration data values from input register 7 and shadow input register 3 in a manner consistent with state table 700B of FIG. 8B.

Table 5 illustrates the values of the control signal CTRL ([7:0]) required to route the configuration data values in the manner defined by state table 700B (FIG. 8B).

TABLE 5

| State | CTRL[7:0] |
| --- | --- |
| State 0 | Don't Care |
| State 1 | 0000 0001 |
| State 2 | 0000 0010 |
| State 3 | 0000 0100 |
| State 4 | 0000 1000 |
| State 5 | 0001 0000 |
| State 6 | 0010 0000 |
| State 7 | 0100 0000 |
| State 8 | 1000 0000 |
| State 0' | Don't Care |
| State 1' | 0000 0001 |
| State 2' | 0000 0010 |
| State 3' | 0000 0100 |
| State 4' | 0000 1000 |
| State 5' | 0001 0000 |
| State 6' | 0010 0000 |
| State 7' | 0100 0000 |
| State 8' | 1000 0000 |
| State 0" | Don't Care |
| State 1" | 0000 0001 |
| State 2" | 0000 0010 |

The loading of configuration register 64 through multiplexer array 62 is now described. As described above in connection with FIGS. 8A and 8B, during State 1 the first and second 32-bit configuration data values A[31:0] and B[31:0] are loaded into shadow input register 3 and input register 7, respectively. As a result, during State 1, the configuration data value S[31:0] is equal to the first configuration data value A[31:0], and the configuration data value IR[31:0] is equal to the second configuration data value B[31:0]. Also during State 1, the control signal CTRL [7:0] is controlled to have a value of 0000 0001 (i.e., CTRL[0] is asserted). As a result, the configuration data bits on the first input terminals of multiplexers 901–909, 911–919, 921–929, and 931–939 (i.e., A[31:0] and B[31:28]) are provided to configuration register 64 during State 1.

Configuration register 64 is clocked at the beginning of State 1, thereby loading the configuration data bits on the first input terminals of multiplexers 901–909, 911–919, 921–929, and 931–939 (i.e., A[31:0] and B[31:28]) into configuration register 64.

As described in connection with FIGS. 8A and 8B, during State 2 the second and third 32-bit configuration data values B[31:0] and C[31:0] are loaded into shadow input register 3 and input register 7, respectively. As a result, during State 2 the configuration data value S[31:0] is equal to the second configuration data value B[31:0], and the configuration data value IR[31:0] is equal to the third configuration data value C[31:0]. Also during State 2, the control signal CTRL[7:0] is controlled to have a value of 0000 0010 (i.e., CTRL[1] is asserted). As a result, the configuration data bits on the second input terminals of multiplexers 901–909, 911–919, 921–929, and 931–939 (i.e., B[27:0] and C[31:24]) are provided to configuration register 64 during State 2.

Configuration register 64 is clocked at the beginning of State 3, thereby loading the configuration data bits on the second input terminals of multiplexers 901–909, 911–919, 921–929, and 931–939 (i.e., B[27:0] and C[31:24]) into configuration register 64.

The above-described process is repeated for the various states as defined by state tables 700A and 700B and Table 5.

Figure 12:
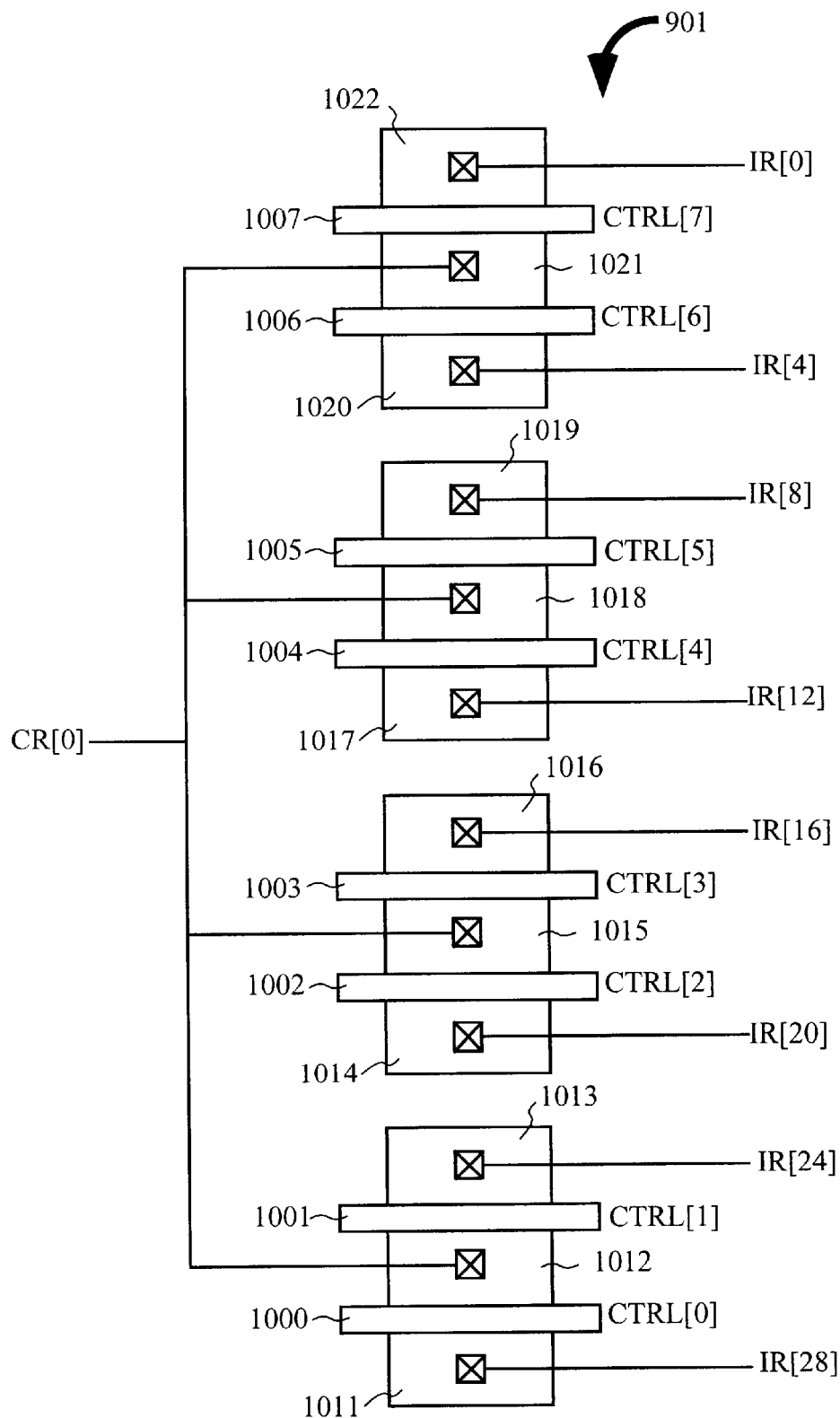
FIG. 12 is a layout diagram of a portion of the multiplexer of FIG. 10A in accordance with one embodiment of the present invention.

One advantage of multiplexers 901–909, 911–919, 921–929, and 931–939 is that they can be laid out in an area-efficient manner. FIG. 12 is a layout diagram of a portion of multiplexer 901, which includes gate electrodes 1000–1007 and source/drain regions 1011–1022. In the described embodiment, the n-type source/drain regions 1011–1022 are fabricated in a monocrystalline silicon substrate in accordance with well known semiconductor processing techniques. Source/drain regions 1011–1022 are stacked in a column along a first axis. Gate electrodes 1000–1007 extend substantially in parallel to one another along a second axis. The second axis is perpendicular to the first axis. Gate electrodes 1000–1007 are coupled to receive control signals CTRL[0]–CTRL[7], respectively. It is understood that gate electrodes 1000–1007 are located on a gate oxide layer (SiO$_2$) that is formed over the silicon substrate. It is further understood that p-type channel regions are located in the substrate beneath the gate electrodes 1000–1007. These elements are formed in accordance with conventional semiconductor processing techniques.

Contacts, which are illustrated as squares containing X's, provide electrical contact to source/drain regions 1011–1022 at the upper surface of the silicon substrate. These contacts extend upward from the substrate to contact a first conductive layer (not shown in FIG. 12), which overlies (and is electrically insulated from) the gate electrodes 1000–1007. The first conductive layer is described in more detail in connection with FIG. 13.

Multiplexer 901 uses an interleaved transistor configuration. Thus, input signal IR[0] is provided to source/drain region 1022 and input signal IR[4] is provided to source/drain region 1020. From source/drain region 1022, the input signal IR[0] can be transmitted to source/drain region 1021 as the output signal CR[0] by asserting control signal CTRL[7] on gate electrode 1007. Similarly, from source/drain region 1020, the input signal IR[4] can be transmitted to source/drain region 1021 as the output signal CR[0] by asserting control signal CTRL[6] on gate electrode 1006. Interleaving the transistors of multiplexer 901 in this manner minimizes the layout area of multiplexer 901. Multiplexers 902–909, 911–919, 921–929, and 931–939 have layouts identical to multiplexer 901.

Figure 13:
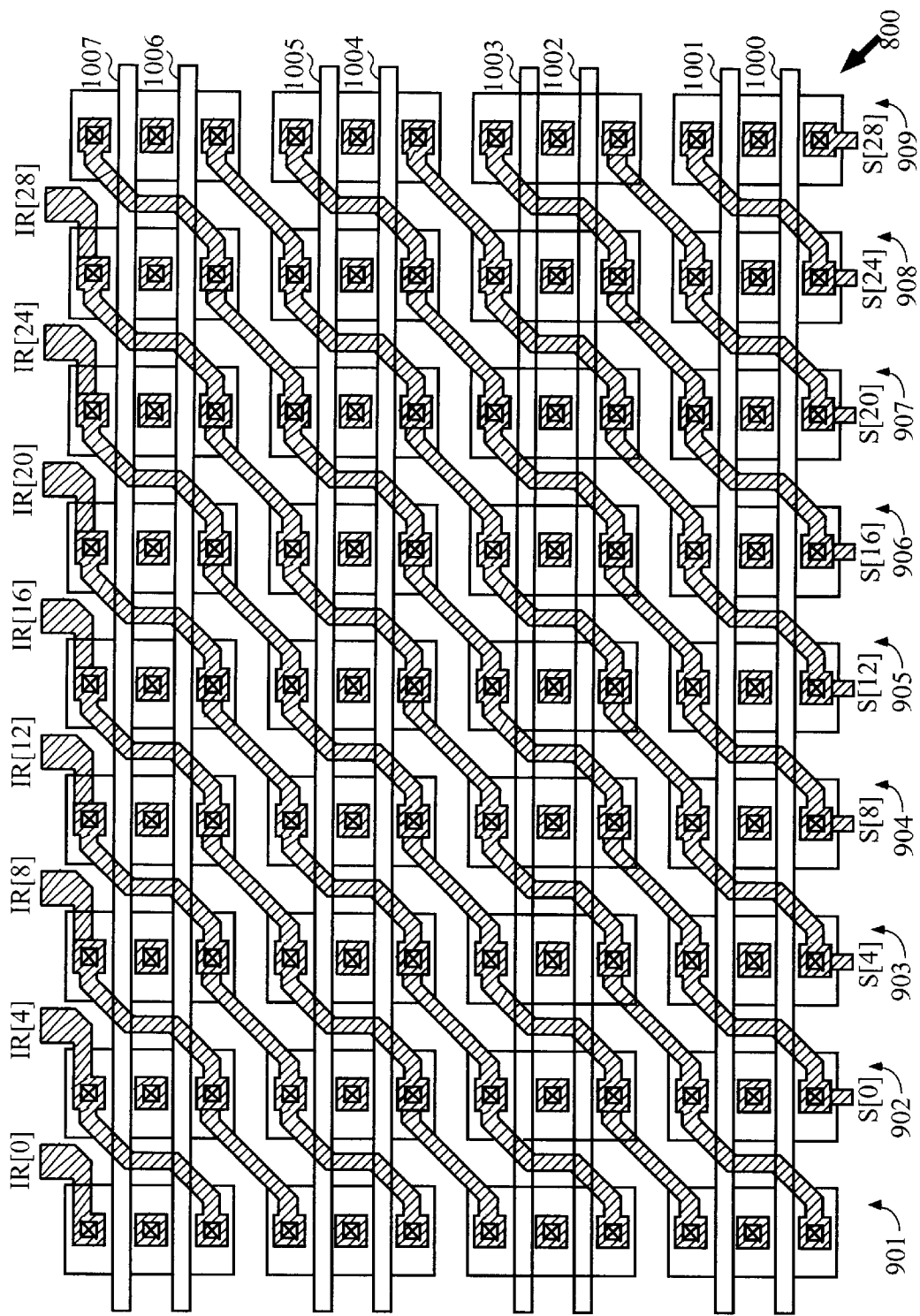
FIG. 13 is a layout diagram of the multiplexer of FIG. 10A in accordance with one embodiment of the present invention.

FIG. 13 is a layout diagram of multiplexer 800, which includes multiplexers 901–909. Multiplexers 901–909 are laid out adjacent to one another, thereby providing a rectangular layout area. Multiplexers 901–909 share gate electrodes 1000–1007, which were described above in connection with FIG. 12. FIG. 13 illustrates the traces of a first metal layer, which are shown as shaded regions. Connections between the first metal layer and the underlying source drain regions are illustrated as squares containing X's. Input signals IR[0, 4, 8, 12, 16, 20, 24, 28] and S[0, 4, 8, 12, 16, 20, 24, 28] are applied to the traces of the first metal layer as illustrated. In general, the first metal layer includes serpentine traces (which receive the input signals), and square traces (which provide the output signals). The serpentine traces of the first metal layer shift upward one bit position as they extend from the left to the right. This configuration enables multiplexer 800 to route the input signals in the manner described above in state tables 700A–700B (FIGS. 8A and 8B), Table 1111 (FIG. 11) and Table 5. Each of multiplexers 901–909 includes a set of four square traces, which are aligned along the first (vertical) axis. Each set of square traces is commonly connected by a trace of a second metal layer (not shown in FIG. 13). The output signals CR[0, 4, 8, 12, 16, 20, 24, 28, 32] are routed on these traces of the second metal layer.

Figure 14:
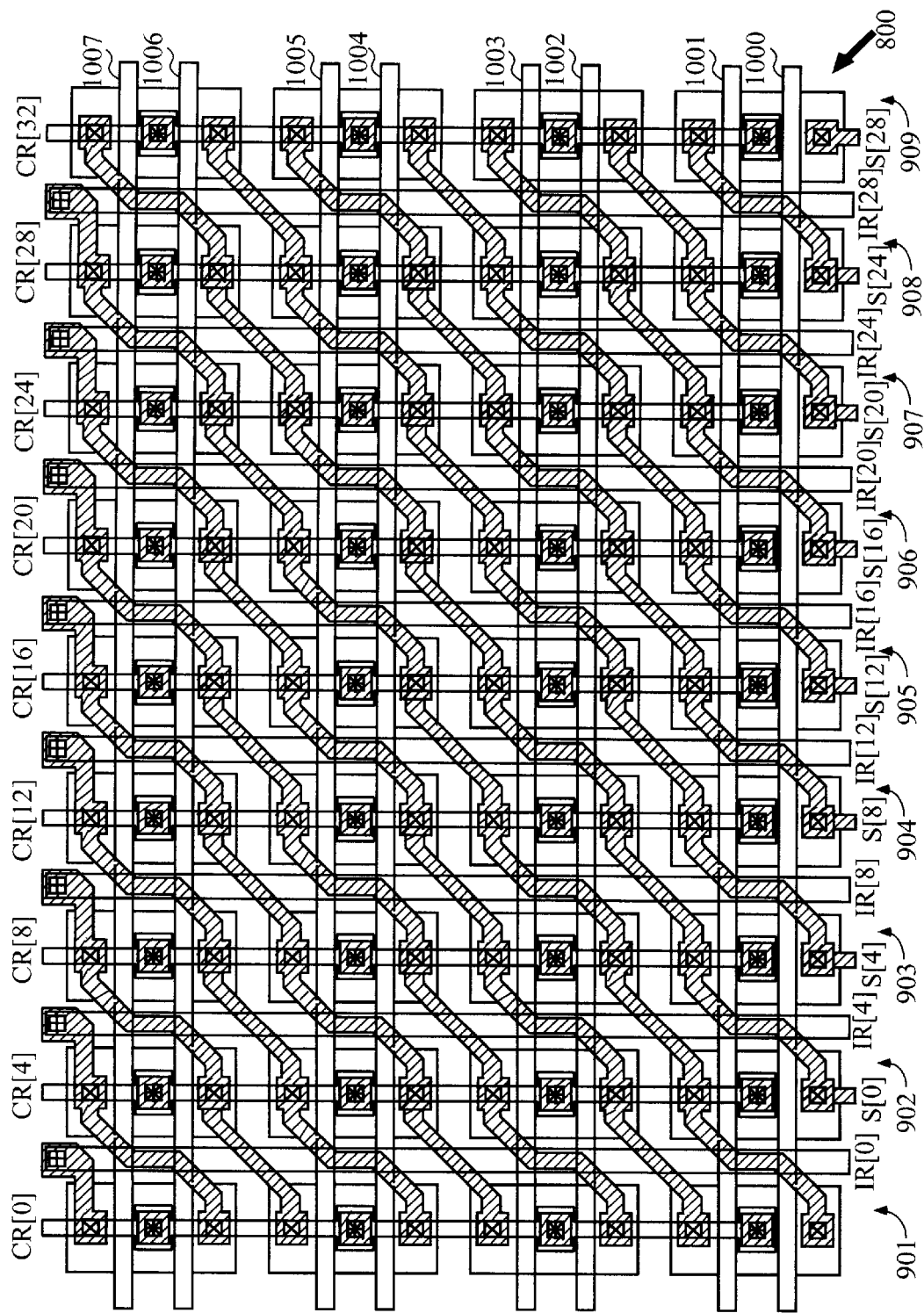
FIG. 14 is a layout diagram of the multiplexer of FIG. 10A that illustrates a second metal layer, in accordance with one embodiment of the present invention.

FIG. 14 is a layout diagram of multiplexer 800 that illustrates the second metal layer. The second metal layer includes traces that extend along the first (vertical) axis. Connections between the second metal layer and the first metal layer are illustrated as squares containing+'s. Connections between the second metal layer, the first metal layer, and a source drain region are therefore illustrated as squares containing both X's and +'s. Selected traces of the second metal layer enable input signals IR[0, 4, 8, 12, 16, 20, 24, 28] to be routed to multiplexer 800 from the bottom of the multiplexer structure. This enables all of the input signals to multiplexer 800 to be received at one edge of the multiplexer structure. Selected traces of the second metal layer route the output signals to the top of multiplexer 800. As a result, the output signals CR[0, 4, 8, 12, 16, 20, 24, 28, 32] of multiplexer 800 are provided at the edge of the multiplexer structure opposite from the input signals.

The structure of multiplexer 800 is repeated for multiplexers 801–803. In one embodiment, multiplexers 800–803 are positioned end-to-end, with gate electrodes 1000–1007 extending in parallel across all four multiplexers 800–803. This placement advantageously results in an area-efficient layout for multiplexers 800–803.

Third Embodiment of the Invention

A third embodiment of the invention includes a circuit for controlling the configuration of an FPGA with CLBs having a height of twenty configuration memory cells (20-cell CLBs). Eighteen of the twenty configuration memory cells are identical to the eighteen configuration memory cells described above in connection with configuration circuits 200 and 600. The two additional rows of configuration memory cells in each CLB are provided to control new (additional) functions within each CLB. The FPGA of the third embodiment can be configured with a bit stream intended for the 20-cell CLB. This bit stream is referred to as a "type B bit stream". When the FPGA is programmed with a type B bit stream, the new features controlled by the two additional rows of configuration memory cells are enabled.

Alternatively, the FPGA can be configured with a bit stream intended for CLBs having a height of 18 configuration memory cells (18-cell high CLBs). This bit stream, which was described above in connection with circuits 200 and 600, is referred to as a "type A bit stream". When the FPGA is programmed with a type A bit stream, the new features controlled by the two additional rows of configuration memory cells are not enabled, and the FPGA operates as if it has 18-cell high CLBs.

Figure 16:
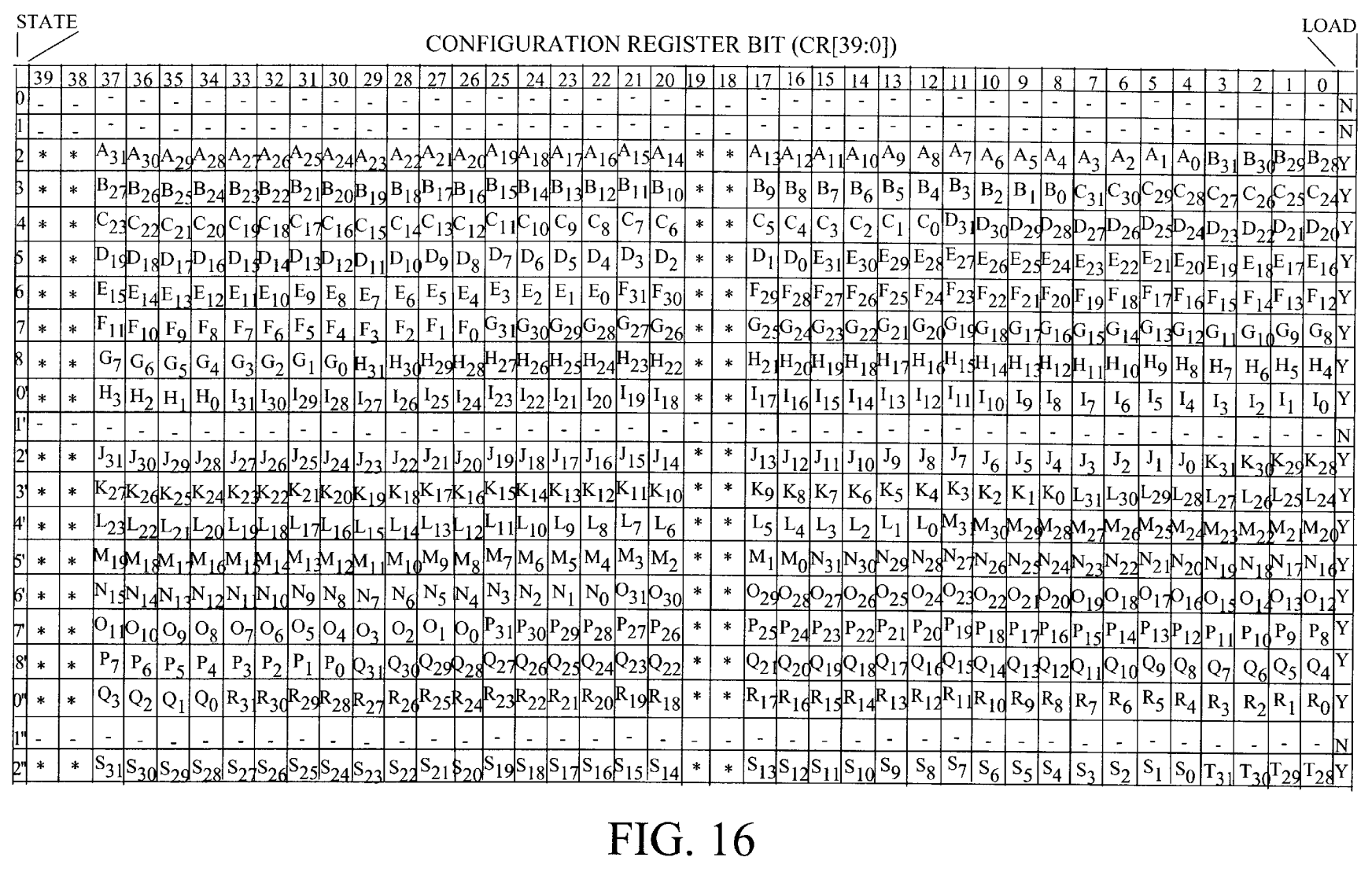

In the third embodiment, two different state sequences are supported, one for a type A bit stream, and another for a type B bit stream. The state sequences for type B and type A bit streams are shown in FIGS. 15 and 16, respectively. The circuitry required by the third embodiment is similar to circuitry 600, which was described above in connection with FIGS. 7–14. However, because the CLBs have a height of 20 configuration memory cells in the third embodiment, the configuration register 64 is modified to have a width of 40 bits (i.e., the lowest multiple of the CLB height greater than the maximum input data bus width of 32-bits). Multiplexer array 62 must also be modified to support the state sequences described below.

FIG. 15 illustrates the state sequence for configuring the FPGA in response to a type B bit stream. It is noted that the beginning of the type B bit stream contains a configuration instruction set (CIS), which is provided to configuration state machine 15 and which identifies the bit stream as a type B bit stream. In response to this CIS, the configuration state machine 15 follows the state sequencing of FIG. 15. The state sequence shown in FIG. 15 is similar to that of FIG. 8B, except that type B bit stream data is loaded to a 40-bit configuration register (rather than a 36-bit configuration register). As a result, only five states are required to load five 32-bit configuration data values.

FIG. 16 illustrates the state sequence for configuring the FPGA in response to a type A bit stream. It is noted that the beginning of the type A bit stream contains a CIS, which is provided to configuration state machine 15 and which identifies the bit stream as a type A bit stream. In response to this CIS, configuration state machine 15 follows the state sequencing of FIG. 16. The nine state sequence shown in FIG. 16 is similar to that of FIG. 8B. However, the configuration data bits are only loaded into bit locations CR[37:20] and CR[17:0] of the 40-bit configuration register. The configuration state machine loads bit locations CR[39:38] and CR[19:18] of the configuration register with values (identified by asterisks), that disable the new functions provided by the two new rows of configuration memory cells in each CLB. Bit locations CR[39:38] and CR[19:18] correspond to the two new rows of configuration memory cells in a pair of CLBs.

In one embodiment, the new logical functions in the FPGA are designed to be enabled or disabled by the logic value in one or more configuration memory cells. Preferably, all logic high (or all logic low) values consistently enable all of the new functions throughout the FPGA. When loading a Type A bit stream in a Type B FPGA, the configuration state machine simply loads all logic low (or all logic high) bits into bit locations CR[39:38] and CR[19:18], and the functions are thereby disabled.

An advantage of this embodiment is that when new bit stream types or new bus widths must be supported in new generations of FPGAs, the interface can be adapted by modifying the configuration state machine, the multiplexer array, and the configuration register. The internal configuration logic of the FPGA need not be changed.

Fast Readback Implementation

Figure 17:
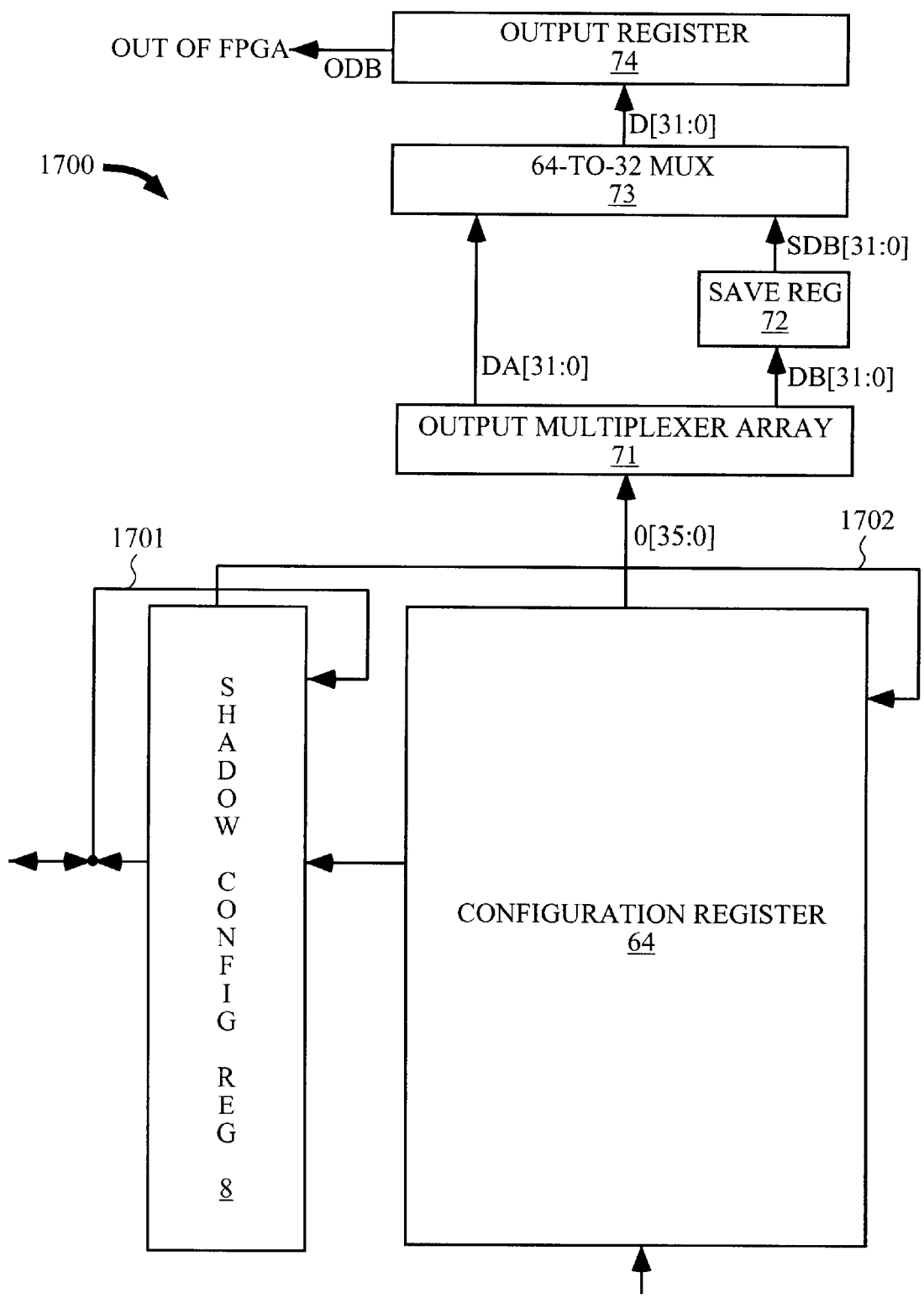
FIG. 17 is a block diagram of configuration readback circuitry in accordance with one embodiment of the present invention.

In one embodiment, circuitry is provided to enable the configuration data values stored in memory array 1 to be read back in a fast and efficient manner. In the described embodiment, each configurable block has a height of 18 memory cells. FIG. 17 is a block diagram of such readback circuitry 1700, which includes shadow configuration register 8, configuration register 64, output multiplexer array 71, save register 72, 64-to-32 multiplexer 73 and output register 74.

In general, readback circuitry 1700 operates as follows. Initially, the configuration data values stored in one of configuration memory frames $F_0$–$F_N$ of configuration memory array 1 are loaded into shadow configuration register 8 (shown as path 1701). These configuration data values are then loaded into configuration register 64 (shown as path 1702). From configuration register 64, the configuration data values are shifted up and into output multiplexer array 71 as a 36-bit output configuration data value O[35:0]. Output multiplexer array 71 is controlled to route the output configuration data value O[35:0] (along with logic 0 bits, as described in more detail below) as two 32-bit configuration data values DA[31:0] and DB[31:0]. Save register 72 saves the configuration data value DB[31:0] and provides saved data value SDB[31:0]. 64-to-32 multiplexer 73 is controlled to route thirty-two of the configuration data bits from configuration data values DA[31:0] and SDB[31:0] as the output configuration data value D[31:0]. The output configuration data value D[31:0] is loaded into output register 74 and then routed out of the FPGA. These circuits are described in more detail below. Because the readback operation is performed largely in parallel, the speed of the readback operation is much faster than in conventional FPGAs.

Figure 18:
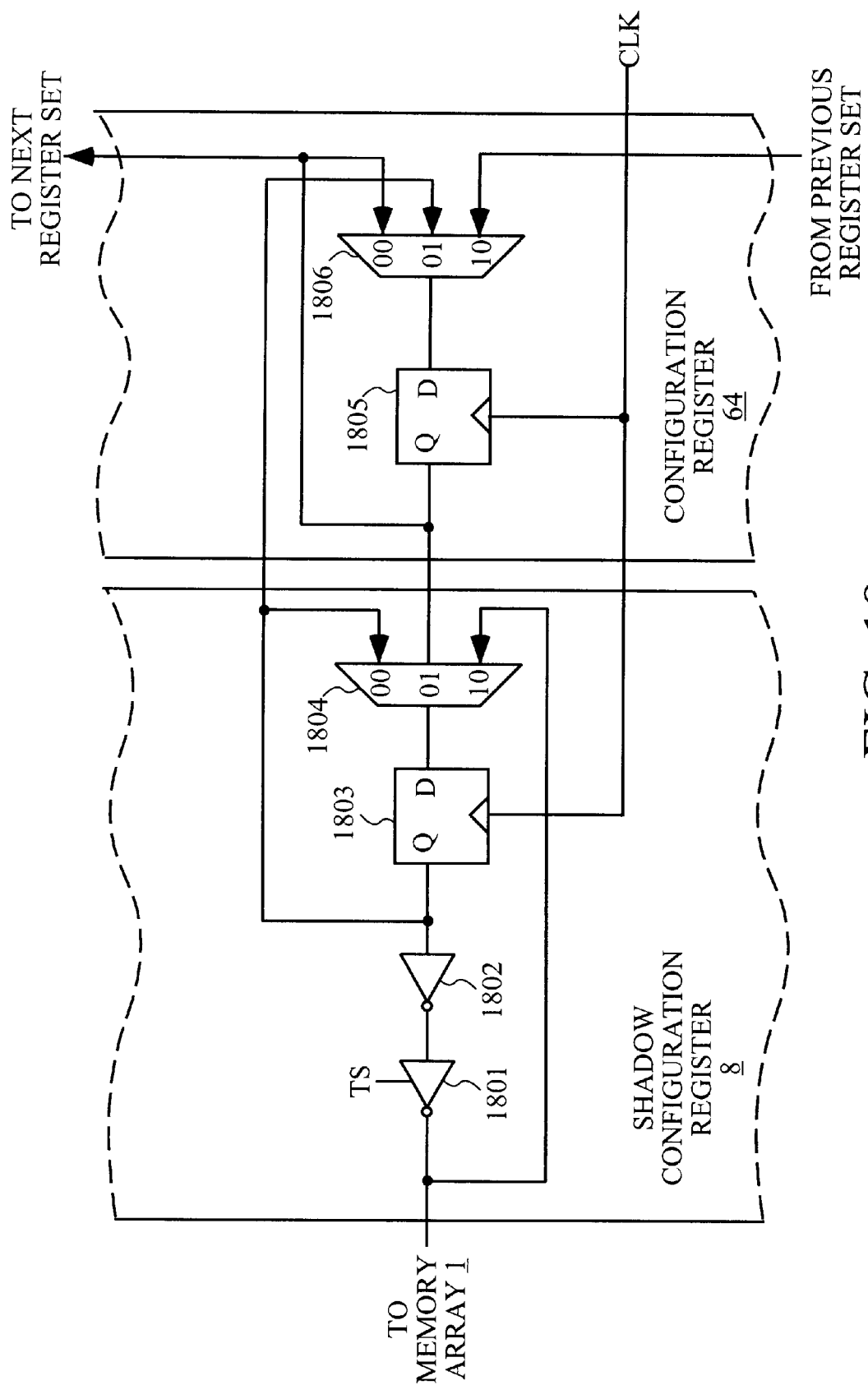
FIG. 18 is a circuit diagram of a bit-slice of the configuration register and shadow configuration register of FIG. 17 in accordance with one embodiment of the present invention.

FIG. 18 is a circuit diagram of a bit-slice of shadow configuration register 8 and configuration register 64. This slice includes tri-state inverter 1801, inverter 1802, flip-flop 1803, 3-to-1 multiplexer 1804, flip-flop 1805 and 3-to-1 multiplexer 1806. Although only a single bit-slice is described, it is understood that all of the bit slices of shadow configuration register 8 and configuration register 64 operate in the same manner.

Configuration data values are written to memory array 1 in the manner described above in connection with FIGS. 7–14. For example, a configuration data bit from the previous register set is shifted into flip-flop 1805 through multiplexer 1806. After the entire configuration register 64 is loaded, this configuration data bit is shifted into flip-flop 1803 through multiplexer 1804. The tri-state buffer signal TS is then enabled, thereby allowing the configuration data bit to be transferred from flip-flop 1803, through inverters 1801–1802, into configuration memory array 1.

The readback operation takes place as follows. Configuration state machine 15 de-asserts the tri-state enable signal TS and addresses one of the configuration memory frames $F_0$–$F_N$ in the manner described above in connection with FIG. 7. The addressed configuration data bit is thereby routed from the addressed configuration memory frame to the "10" input terminal of multiplexer 1804. Configuration state machine 15 controls multiplexer 1804 to route this configuration data bit to the D input terminal of flip-flop 1803. Configuration state machine 15 then asserts a clock signal CLK that causes the configuration data bit to be latched in flip-flop 1803.

Configuration state machine 15 then applies a "00" signal to multiplexer 1804, thereby causing the configuration data bit to be routed back to the D input terminal of flip-flop 1803 during subsequent clock cycles. Configuration state machine 15 also applies a "01" value to multiplexer 1806, thereby causing the configuration data bit to be routed through multiplexer 1806 to the D input terminal of flip-flop 1805. The CLK signal is again asserted (under the control of configuration state machine 15), thereby latching the configuration data bit into flip-flop 1805.

The above-described process loads one bit into each of the 1-bit registers in configuration memory 64, thereby filling configuration memory 64. After configuration register 64 has been filled with configuration data values, the uppermost register set applies a 36-bit configuration data value O[35:0] to output multiplexer array 71.

After the first configuration data value O[35:0] has been processed (as described in more detail below), configuration state machine 15 applies a "10" value to multiplexer 1806 and asserts the CLK signal. At this time, the configuration data bit from the lower adjacent register set is shifted up into flip-flop 1805. More generally, the configuration data values in configuration register 64 are all shifted upward by one register set. At this time, a second configuration data value O[35:0] is provided to output multiplexer array 71. This second configuration data value is then processed, as described in more detail below. This process continues until all of the configuration data values in configuration register 64 are shifted out the top of configuration register 64. Because configuration data values are read from configuration memory array 1 in parallel, and because the configuration data values are read out of configuration register 64 in parallel, the readback operation is relatively fast when compared to conventional readback schemes.

Figure 19:
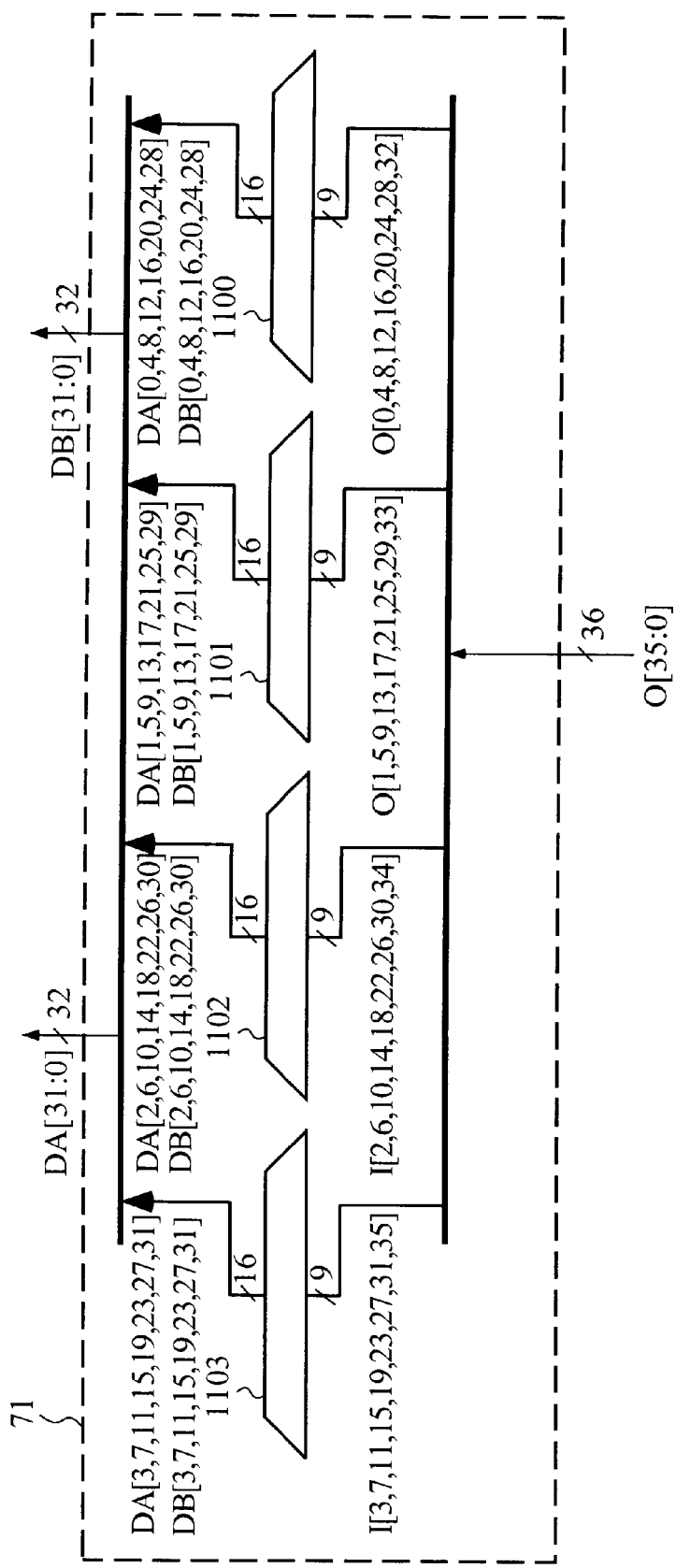
FIG. 19 is a circuit diagram illustrating the output multiplexer array of FIG. 17 in accordance with one embodiment of the present invention.

FIG. 19 is a circuit diagram illustrating output multiplexer array 71. Output multiplexer array 71 includes four 9-to-16 multiplexers 1100–1103. Configuration register 64 provides the 36-bit configuration data value O[35:0] to multiplexers 1100–1103. More specifically, the bits of the configuration data value O[35:0] are provided to the input terminals of multiplexers 1100–1103 as set forth below in Table 6 (and in FIG. 19).

TABLE 6

| Multiplexer | Input Signals |
|---|---|
| 1100 | O[0, 4, 8, 12, 16, 20, 24, 28, 32] |
| 1101 | O[1, 5, 9, 13, 17, 21, 25, 29, 33] |
| 1102 | O[2, 6, 10, 14, 18, 22, 26, 30, 34] |
| 1103 | O[3, 7, 11, 15, 19, 23, 27, 31, 35] |

Thus, each of multiplexers 1100–1103 receives every fourth bit of configuration data value O[35:0].

Each of multiplexers 1100–1103 provides two 8-bit output signals in response to the applied configuration data bits. These 8-bit output signals are a combination of the applied configuration data bits O[35:0] and logic "0" values. The output signals provided by multiplexers 1100–1103 are set forth below in Table 7 (and in FIG. 19).

TABLE 7

| Multiplexer | Output Signals |
|---|---|
| 1100 | DA[0, 4, 8, 12, 16, 20, 24, 28] |
|  | DB[0, 4, 8, 12, 16, 20, 24, 28] |
| 1101 | DA[1, 5, 9, 13, 17, 21, 25, 29] |
|  | DB[1, 5, 9, 13, 17, 21, 25, 29] |
| 1102 | DA[2, 6, 10, 14, 18, 22, 26, 30] |
|  | DB[2, 6, 10, 14, 18, 22, 26, 30] |
| 1103 | DA[3, 7, 11, 15, 19, 23, 27, 31] |
|  | DB[3, 7, 11, 15, 19, 23, 27, 31] |

The output signals provided by multiplexers 1100–1103 are routed on a pair of 32-bit buses. One of the buses carries the 32-bit configuration data value DA[31:0] and the other bus carries the 32-bit configuration data value DB[31:0].

Multiplexers 1100–1103 are controlled by configuration state machine 15. As described in more detail below, each of multiplexers 1100–1103 shares the same eight control lines. As a result, configuration state machine 15 controls the entire multiplexer array 71 using only eight control signals, contributing to the efficiency of multiplexer array 71.

Figure 20:
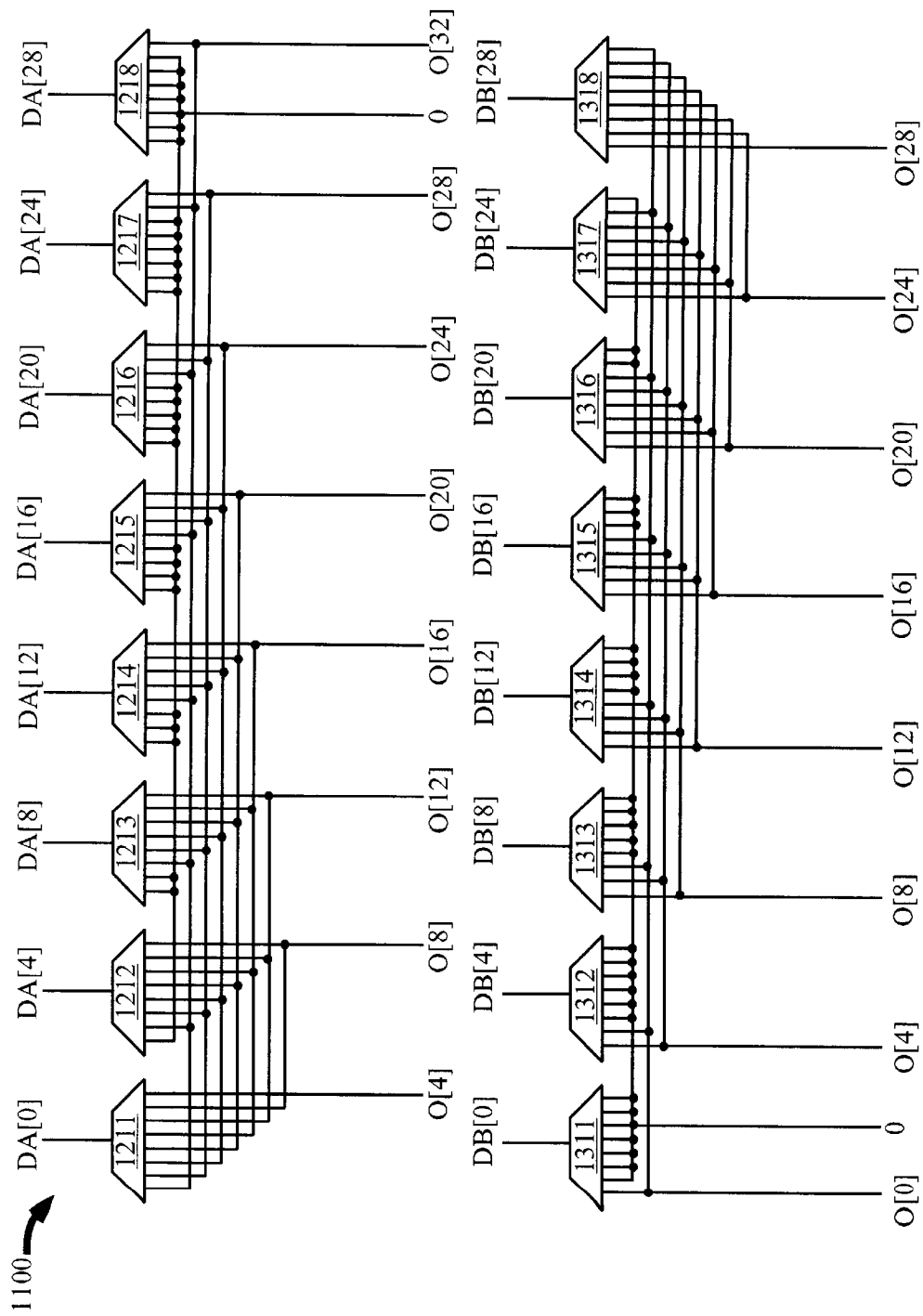
FIG. 20 is a block diagram of a multiplexer within the output multiplexer array of FIG. 19 in accordance with one embodiment of the present invention.

FIG. 20 is a circuit diagram of multiplexer 1100 in accordance with one embodiment of the present invention. The structure of multiplexers 1101–1103 is identical to the structure of multiplexer 1100. Multiplexers 1101–1103 are therefore not discussed in detail herein. Multiplexer 1100 includes sixteen 8-to-1 multiplexers 1211–1218 and 1311–1318. Multiplexers 1211–1218 and 1311–1318 are coupled to receive configuration data bits O[0, 4, 8, 12, 16, 20, 24, 28, 32] and a logic "0" value as illustrated.

Each of multiplexers 1211–1218 and 1311–1318 has eight input terminals. The rightmost input terminal of each multiplexer is defined as the first input terminal of the multiplexer, and the leftmost input terminal of each multiplexer is defined as the eighth input terminal of the multiplexer. The intermediate input terminals are defined as consecutive input terminals between the rightmost and leftmost input terminals (e.g., the third input terminal from the right is the third input terminal.)

Each of multiplexers 1211–1218 and 1311–1318 is controlled by the same eight control signals X[7:0] (not shown). These eight control signals X[7:0] are controlled by configuration state machine 15 to have eight different states. In each of the eight states, one and only one of the control signals X[7:0] is asserted. When the first control signal X[0] is asserted, each of multiplexers 1211–1218 and 1311–1318 passes the input signal applied to its first input terminal. When the eighth control signal X[7] is asserted, each of multiplexers 1211–1218 and 1311–1318 passes the input signal applied to its eighth input terminal. Table 8 provides a complete description of each of the eight states.

TABLE 8

| State | X[7:0] | Enabled Input Terminal of Multiplexers 1211–1218 & 1311–1318 |
|---|---|---|
| 1 | 0000 0001 | 1st Input Terminal (rightmost) |
| 2 | 0000 0010 | 2nd Input Terminal |
| 3 | 0000 0100 | 3rd Input Terminal |
| 4 | 0000 1000 | 4th Input Terminal |
| 5 | 0001 0000 | 5th Input Terminal |
| 6 | 0010 0000 | 6th Input Terminal |
| 7 | 0100 0000 | 7th Input Terminal |
| 8 | 1000 0000 | 8th Input Terminal (leftmost) |

Figure 21:
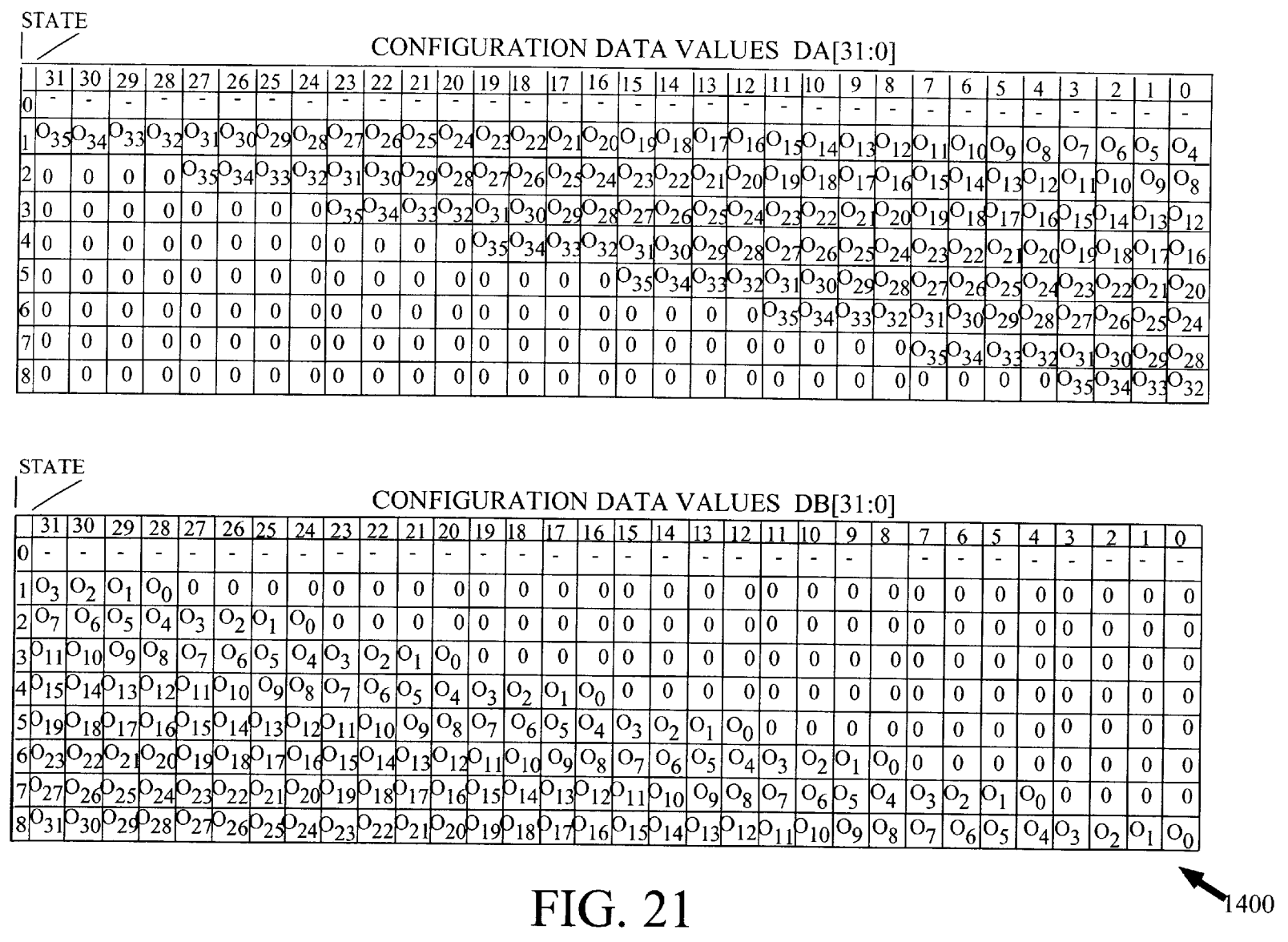

FIG. 21 is a state table 1400 that illustrates the manner in which multiplexers 1100–1103 route the configuration data values O[35:0] and the logic "0" values in response to the control signals X[7:0].

Figure 22:
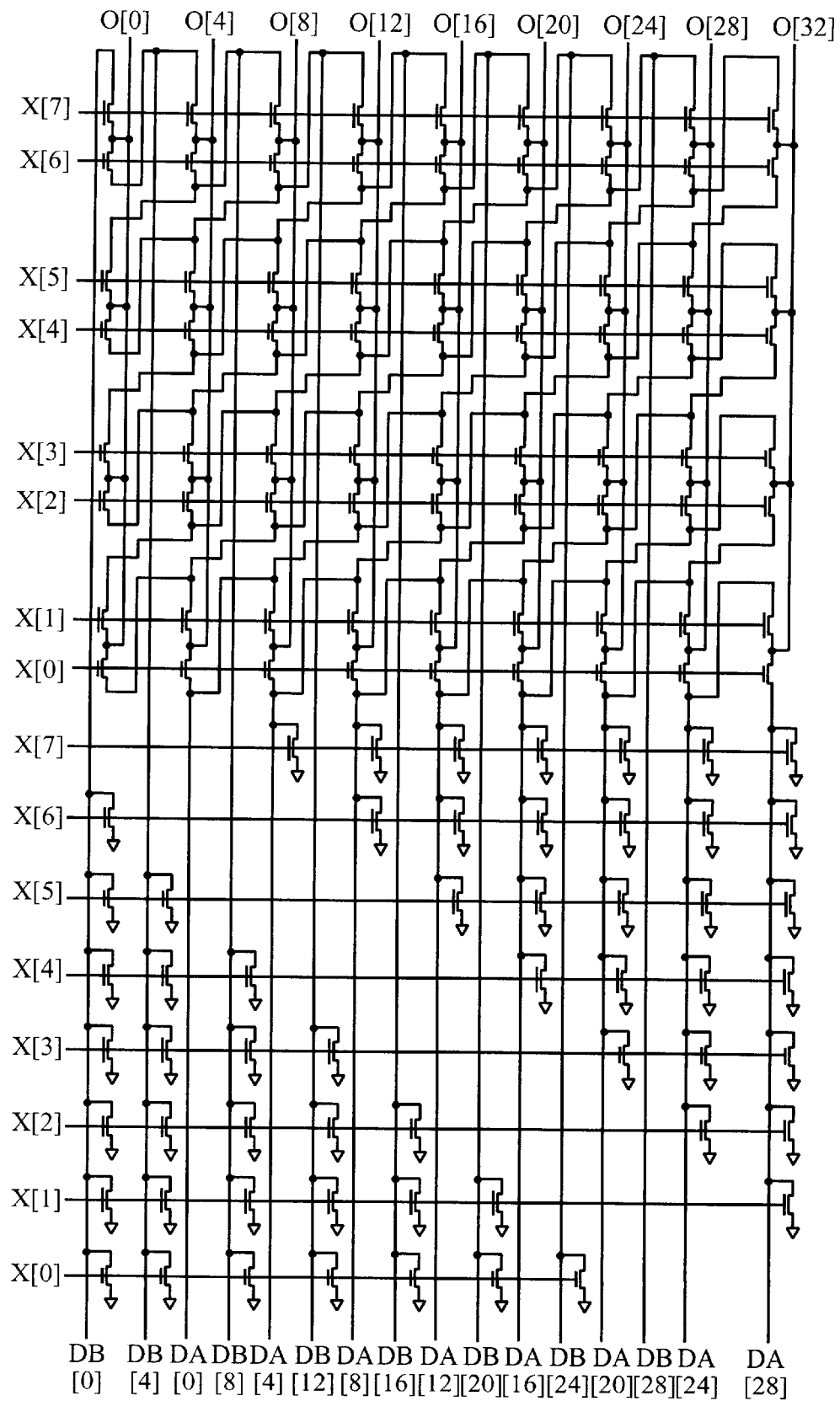
FIG. 22 is a circuit diagram of a multiplexer within the output multiplexer array of FIG. 19 in accordance with one embodiment of the present invention.

FIG. 22 is a circuit diagram illustrating multiplexer 1100. Because multiplexers 1101–1103 are identical to multiplexer 1100, these multiplexers are not described in detail. The circuitry of multiplexers 1100–1103 is similar to the circuitry of multiplexers 800–803. Multiplexers 1100–1103 are therefore laid out in a manner similar to that described above in connection with FIGS. 12–14.

As illustrated in FIG. 17, configuration data value DA[31:0] is provided directly to 64-to-32 multiplexer 73. Configuration data value DB[31:0] is loaded into save register 72 prior to being provided to 64-to-32 multiplexer 73. As described in more detail below, configuration data value DB[31:0] is stored in save register 72 for one cycle prior to being routed through multiplexer 73 as saved data value SDB[31:0].

Figure 23:
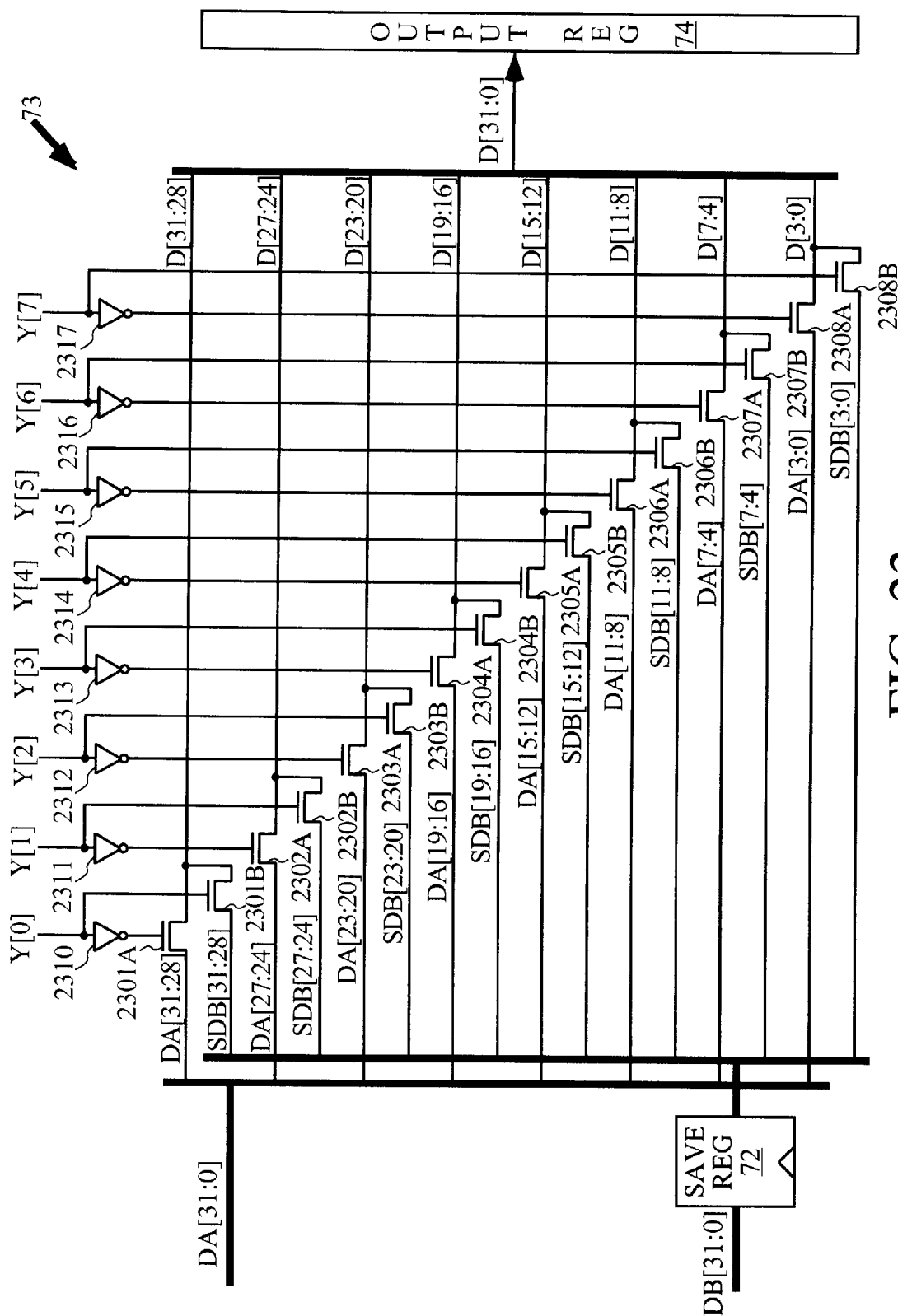
FIG. 23 is a circuit diagram of a 64-to-32 multiplexer in accordance with one embodiment of the present invention.

FIG. 23 is a circuit diagram of 64-to-32 multiplexer 73. Multiplexer 73 includes 4-bit pass circuits 2301A–2308A and 2301B–2308B. Each of pass circuits 2301A–2308A is coupled to receive four bits of configuration data value DA[31:0]. Similarly, each of pass circuits 2301B–2308B is coupled to receive four bits of configuration data value SDB[31:0]. More specifically, pass circuits 2301A–2308A are coupled to receive configuration data bits DA[31:28], DA[27:24], DA[23:20], DA[19:16], DA[15:12], DA[11:8], DA[7:4], and DA[3:0], respectively. Pass circuits 2301B–2308B are coupled to receive configuration data bits SDB[31:28], SDB[27:24], SDB[23:20], SDB[19:16], SDB[15:12], SDB[11:8], SDB[7:4], and SDB[3:0], respectively.

Pass circuits 2301A–2308A and 2301B–2308B are controlled by control signals Y[7:0] and the inverse of these control signals as provided by inverters 2317–2310, respectively. Control signals Y[7:0] are controlled to selectively route thirty-two of the sixty-four applied configuration data bits. Table 9 defines the manner in which the configuration data signals DA[31:0] and SDB[31:0] are routed through multiplexer 73 to create output configuration data value D[31:0] in response to control signals Y[7:0]. Configuration state machine 15 cycles the control signals in the sequence illustrated in Table 9.

TABLE 9

| State | Y[7:0] | D[31:0] |
|---|---|---|
| 0 | 0000 0000 | DA[31:0] |
| 1 | 0000 0001 | DB[31:28], DA[27:0] |
| 2 | 0000 0011 | DB[31:24], DA[24:0] |
| 3 | 0000 0111 | DB[31:20], DA[19:0] |
| 4 | 0000 1111 | DB[31:16], DA[15:0] |
| 5 | 0001 1111 | DB[31:12], DA[11:0] |
| 6 | 0011 1111 | DB[31:8], DA[7:0] |
| 7 | 0111 1111 | DB[31:4], DA[3:0] |
| 8 | 1111 1111 | DB[31:0] |

The transfer of configuration data values from output multiplexer array 71 to 64-to-32 multiplexer 73 is now described. During an initial state (State 0), a first 36-bit configuration data value A[35:0] is applied to output multiplexer array 71. During this initial state, control signals X[7:0] have a value of "0000 0001". As a result, configuration data bits A[35:4] are routed to multiplexer 73 (as configuration data bits DA[31:0]), and configuration data bits A[3:0] are routed to save register 72 (as configuration data bits DB[31:28]). Configuration data bits DB[27:0] have logic zero values. Also during State 0, configuration state machine 15 provides a control signal Y[7:0] having a value of "0000 0000" to 64-to-32 multiplexer 73, thereby causing multiplexer 73 to route configuration data bits A[35:4] to output register 74 (as configuration data bits D[31:0]).

At the beginning of State 1, configuration state machine 15 asserts a clock signal that clocks output register 74, thereby loading configuration data bits A[35:4] into output register 74. The asserted clock signal also clocks save register 72, thereby loading configuration data bits A[3:0] and logic "0" values into save register 72.

At this time, configuration data bits A[35:4] are then read from output register 74 to output data bus ODB having a width of 32 bits. In the described embodiment, the width of the output data bus ODB is selectable in the same manner as the width of the input data bus IDB. Thus, output data bus ODB can have a width of 32, 16 or 8 bits. Other widths are possible in other embodiments.

Also during State 1, a second 36-bit configuration data value B[35:0] is applied to output multiplexer array 71. Configuration state machine 15 causes control signals X[7:0] to have a value of "0000 0010", thereby routing the configuration data bits B[35:8] to multiplexer 73 (as configuration data bits DA[27:0]), and configuration data bits B[7:0] to save register 72 (as configuration data bits DB[31:24]). At this time, configuration state machine 15 provides a control signal Y[7:0] having a value of "0000 0001" to 64-to-32 multiplexer 73, thereby causing multiplexer 73 to route configuration data bits A[3:0] to output register 74 (as configuration data bits D[31:28]) and to route configuration data bits B[35:8] (as configuration data bits D[27:0]) to output register 74. Note that configuration data bits A[3:0] were previously stored in save register 72 at the beginning of State 1.

At the beginning of State 2, configuration state machine 15 asserts a clock signal that clocks output register 74, thereby loading configuration data bits A[3:0] and B[31:8] into output register 74. The asserted clock signal also clocks save register 72, thereby loading configuration data bits B[7:0] and logic "0" values into save register 72.

Also during State 2, a third 36-bit configuration data value C[35:0] is applied to output multiplexer array 71. Configuration state machine 15 causes control signals X[7:0] to have a value of "0000 0100", thereby routing the configuration data bits C[35:12] to multiplexer 73 (as configuration data bits DA[23:0]), and configuration data bits C[11:0] to save register 72 (as configuration data bits DB[31:20]). At this time, configuration state machine 15 provides a control signal Y[7:0] having a value of "0000 0011" to 64-to-32 multiplexer 73, thereby causing multiplexer 73 to route configuration data bits B[7:0] to output register 74 (as configuration data bits D[31:24]) and to route configuration data bits C[35:12] (as configuration data bits D[23:0]) to output register 74.

Processing proceeds in the above-described manner, with a new 36-bit configuration data value being routed by output multiplexer array 71 during each successive state. At the end of State 8, nine 32-bit configuration data values D[31:0] have been provided to output register 74. (See FIG. 21.) Advantageously, a large number of configuration data bits can be read back through circuitry 1700 in a relatively fast manner.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method of operating a multiplexer array, comprising:

applying a first input data value to the multiplexer array during a first cycle;

routing a first portion of the first input data value through the multiplexer array to a first set of output terminals and routing a second portion of the first input data value through the multiplexer array to a first portion of a second set of output terminals during the first cycle;

routing a predetermined voltage level to a second portion of the second set of output terminals during the first cycle;

applying a second input data value to the multiplexer array during a second cycle;

routing a first portion of the second input data value through the multiplexer array to a first portion of the first set of output terminals and further applying the predetermined voltage level to a second portion of the first set of output terminals during the second cycle; and routing a second portion of the second input data value through the multiplexer array to a third portion of the second set of output terminals and further applying the predetermined voltage level to a fourth portion of the second set of output terminals during the second cycle.

2. A 2N-to-N multiplexer array, comprising:

a plurality of Y control input terminals providing Y control signals, where N is a multiple of Y;

a plurality of N first data input terminals providing N first data signals;

a plurality of N second data input terminals providing N second data signals:

a plurality of N output terminals;

control circuitry for coupling the N first data input terminals to the N output terminals when none of the Y control signals are asserted;

control circuitry for coupling an additional N/Y of the second data signals to the N output terminals and de-coupling a corresponding N/Y of the first data signals from the N output terminals when an additional control signal is asserted; and control circuitry for coupling the N second data input terminals to the N output terminals when all of the Y control signals are asserted.

3. A method for selecting data using a 2N-to-N multiplexer array, the multiplexer array having N first data input terminals providing N first data signals, N second data input terminals providing N second data signals, N output terminals, and Y control input terminals providing Y control signals, where N is a multiple of Y, the method comprising the steps of:

a) de-asserting all of the Y control signals;

b) providing the N first data input signals to the N output terminals in response to de-asserting all of the Y control signals;

c) asserting one additional control signal;

d) providing N/Y fewer of the first data input signals and N/Y more of the second data input signals to the N output terminals in response to asserting one additional control signal;

e) repeating steps c and d until all of the Y control signals are asserted; and then f) providing the N second data input signals to the N output terminals in response to all of the asserted Y control signals.

4. A method of operating a multiplexer circuit, comprising:

providing a plurality of M-bit input values to an input bus of the multiplexer circuit over a predetermined number of cycles;

routing a first portion of an M-bit input value to a first N-bit output bus during each of the cycles, wherein N is less than M, and wherein the first portion becomes smaller during successive cycles;

routing a second portion of the M-bit input value to a second N-bit output bus during each of the cycles, wherein the second portion becomes larger during successive cycles; and routing a predetermined logic value to lines of the first and second N-bit output buses that do not receive a portion of the M-bit input value during each of the cycles.

5. The method of claim 4, wherein M is greater than N.

6. The method of claim 4, wherein the number of cycles is a common denominator of M and N.

7. The method of claim 4, wherein the first portion has a width equal to $N-[(M-N)\times(C-1)]$ during cycle C.

8. The method of claim 7, wherein the second portion has a width equal to $C\times(M-N)$ during cycle C.

9. The method of claim 4, wherein the predetermined logic value is applied to $2N-M$ lines of the first and second output buses during each of the cycles.

10. The method of claim 4, wherein N bits of an M-bit data value are provided on the first N-bit output bus during a first cycle of the predetermined number of cycles.

11. The method of claim 10, wherein N bits of an M-bit data value are provided on the second N-bit output bus during a last cycle of the predetermined number of cycles.

12. A multiplexer, comprising:

a first input bus having N lines;

a second input bus having N lines;

a first set of Y pass devices, wherein each pass device in the first set is coupled to N/Y lines of the first input bus;

a second set of Y pass devices, wherein each pass device in the second set is coupled to N/Y lines of the second input bus, wherein each pass device in the second set is associated with a corresponding pass device in the first set; and a set of Y control lines, each being coupled to a pass device in the first set and to the associated pass device in the second set; and an output bus having N lines, wherein the output bus is coupled to the pass devices in the first and second sets.

13. The multiplexer of claim 12, wherein the each of the pass devices in the first set is coupled to a control line through an inverter.

14. The multiplexer of claim 12, wherein each pass device in the first set and the associated pass device in the second set are coupled to the same lines of the output bus.

* * * * *